United States Patent [19]

Nakamura et al.

[11] Patent Number: 5,768,195

[45] Date of Patent: Jun. 16, 1998

[54] SEMICONDUCTOR MEMORY DEVICE

[75] Inventors: Hiroshi Nakamura, Kawasaki; Masaki Momodomi, Yokohama; Yoshihisa Iwata, Yokohama; Ryouhei Kirisawa, Yokohama, all of Japan

[73] Assignee: Kabushiki Kaisha Toshiba, Kawasaki, Japan

[21] Appl. No.: 857,586

[22] Filed: May 16, 1997

Related U.S. Application Data

[63] Continuation of Ser. No. 309,425, Sep. 20, 1994, abandoned.

[30] Foreign Application Priority Data

Sep. 24, 1993 [JP] Japan ................................ 5-238146
May 31, 1994 [JP] Japan ................................ 6-119231

[51] Int. Cl.$^6$ ........................ H01L 27/115; G11C 16/06
[52] U.S. Cl. ................ 365/189.09; 365/226; 365/227; 327/534; 257/48
[58] Field of Search ........................ 365/189.09, 226, 365/227; 327/534; 257/48

[56] References Cited

U.S. PATENT DOCUMENTS

| | | | |
|---|---|---|---|
| 4,233,526 | 11/1980 | Kurogi et al. | 365/184 |
| 4,959,812 | 9/1990 | Momodomi et al. | 365/184 |
| 5,008,856 | 4/1991 | Iwahashi | 365/184 |
| 5,148,394 | 9/1992 | Iwahashi | 365/184 |
| 5,376,840 | 12/1994 | Nakayama | 365/189.09 |

FOREIGN PATENT DOCUMENTS

| | | |
|---|---|---|
| 51-142927 | 12/1976 | Japan . |
| 57-20991 | 2/1982 | Japan . |
| 61-172295 | 8/1986 | Japan . |
| 62-165791 | 7/1987 | Japan . |
| 1-231342 | 9/1989 | Japan . |
| 1-267892 | 10/1989 | Japan . |
| 2-203286 | 8/1990 | Japan . |

*Primary Examiner*—Jerome Jackson
*Attorney, Agent, or Firm*—Oblon, Spivak, McClelland, Maier & Neustadt, P.C.

[57] ABSTRACT

A semiconductor memory device according to the present invention comprises a first conductivity-type semiconductor substrate in which a second conductivity-type well is formed, a memory cell array composed of a plurality of memory cells arranged in a matrix in the second conductivity-type well, and a substrate voltage control circuit selectively outputting an output voltage to the substrate according to an external input signal.

32 Claims, 22 Drawing Sheets

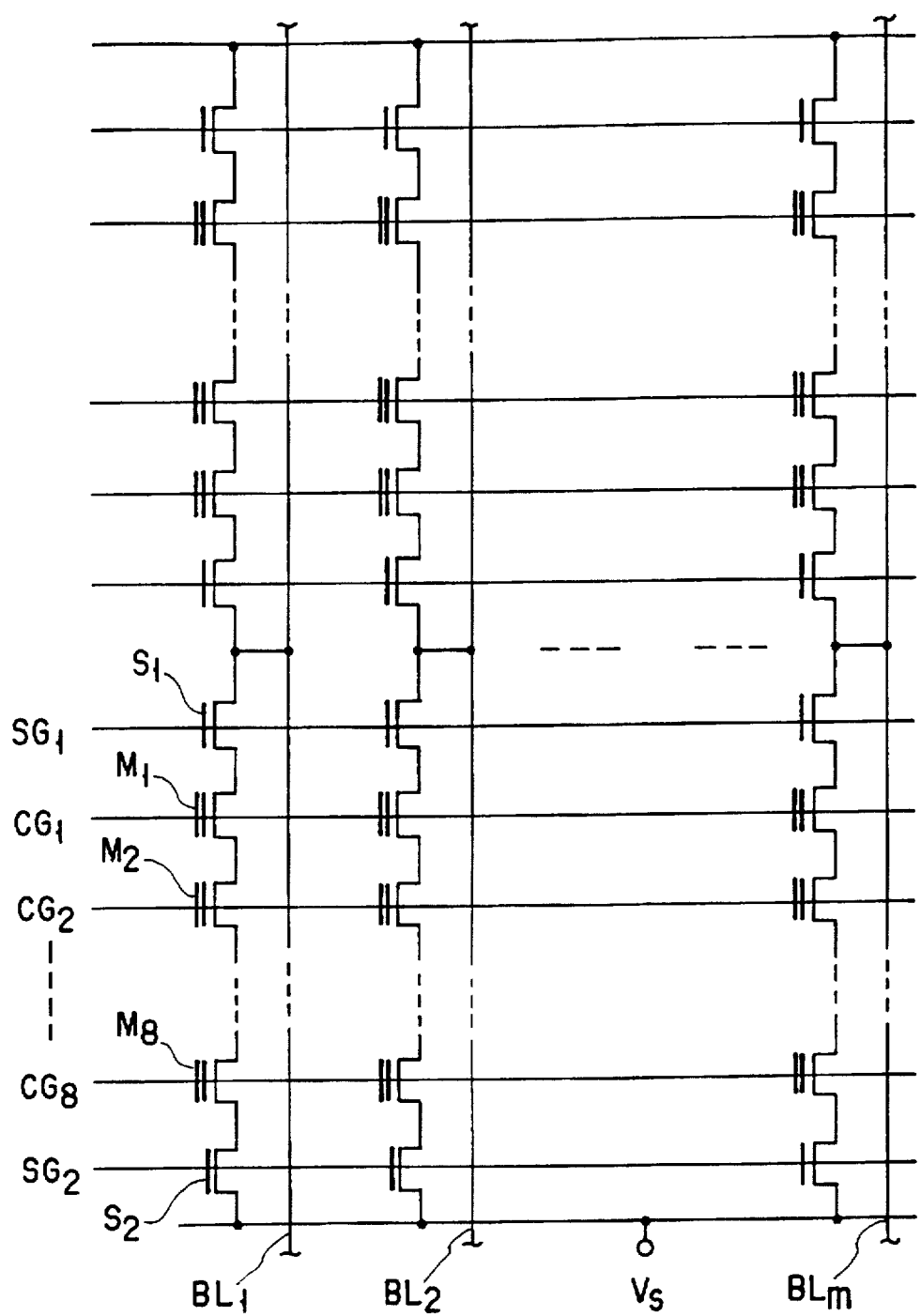
F I G. 6

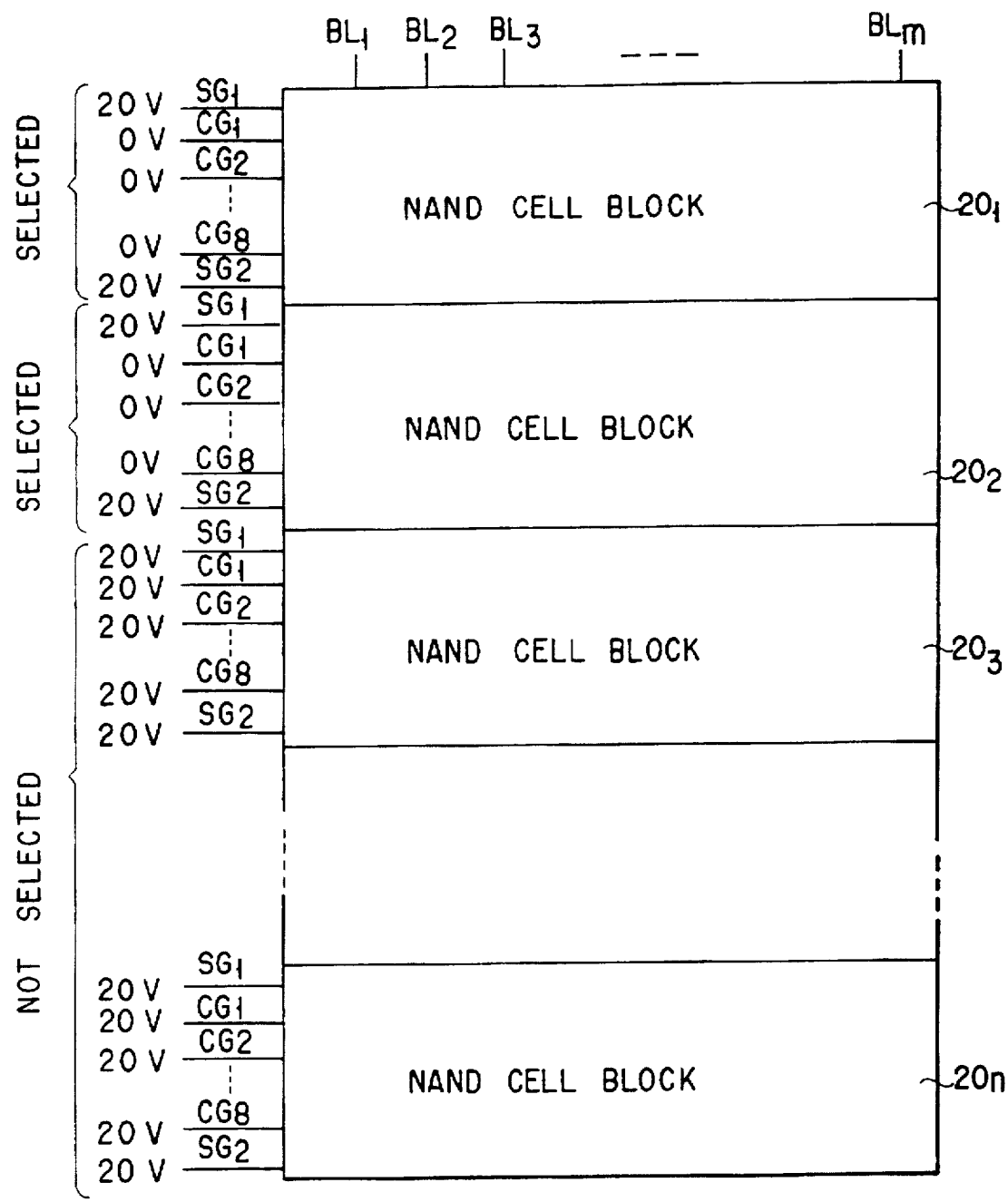
F I G. 7

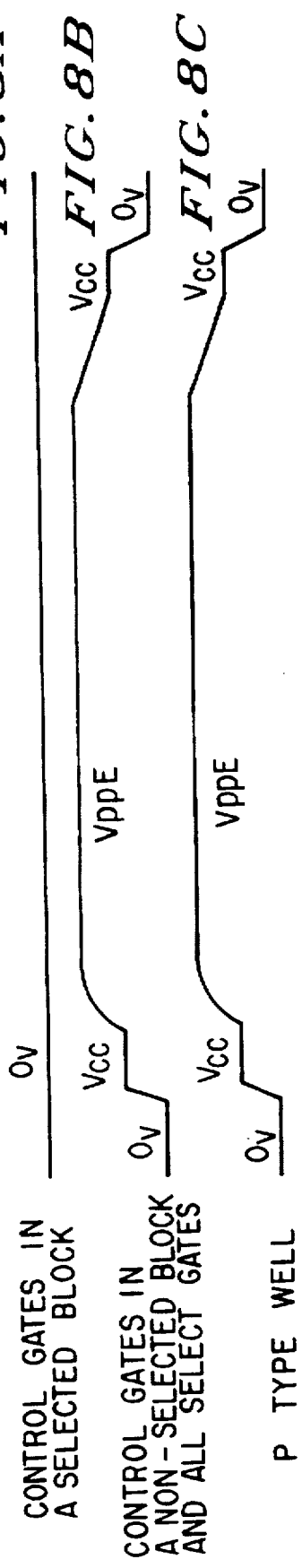
FIG. 8A  CONTROL GATES IN A SELECTED BLOCK
FIG. 8B  CONTROL GATES IN A NON-SELECTED BLOCK AND ALL SELECT GATES
FIG. 8C  P TYPE WELL
FIG. 8D  n TYPE SUBSTRATE

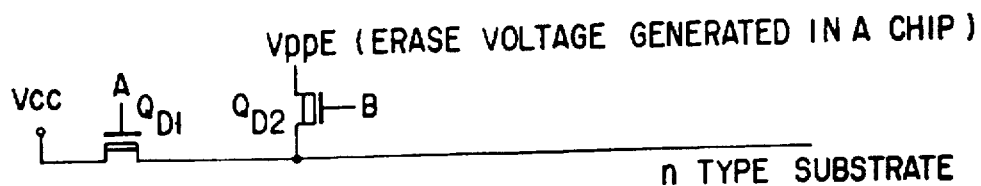
FIG. 10A
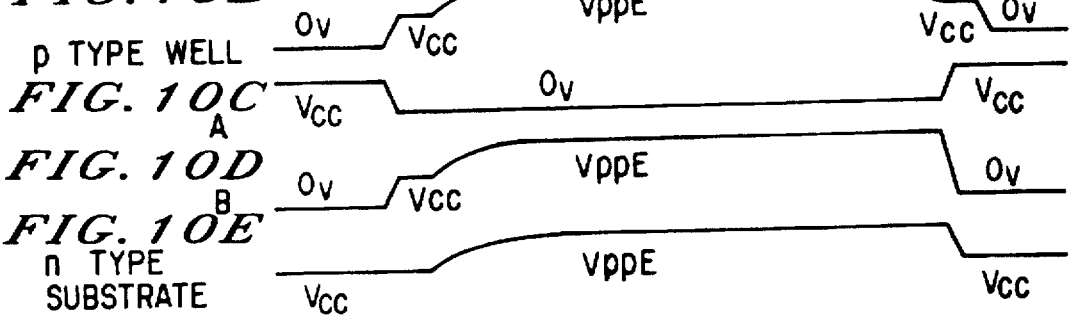
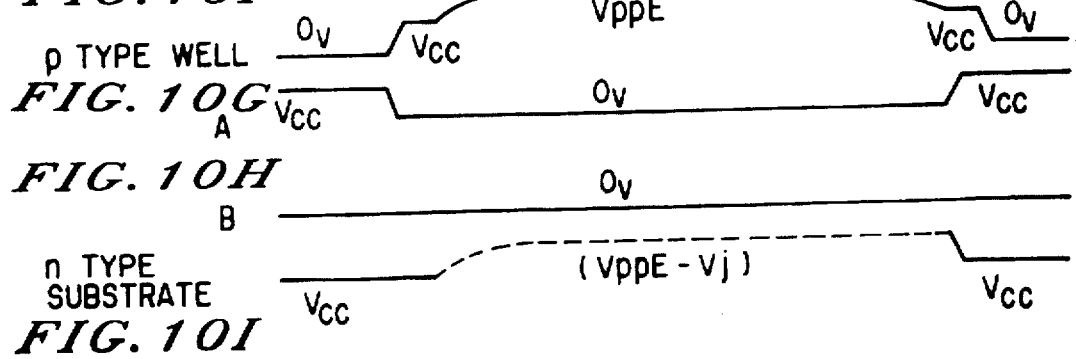

F I G. 11A
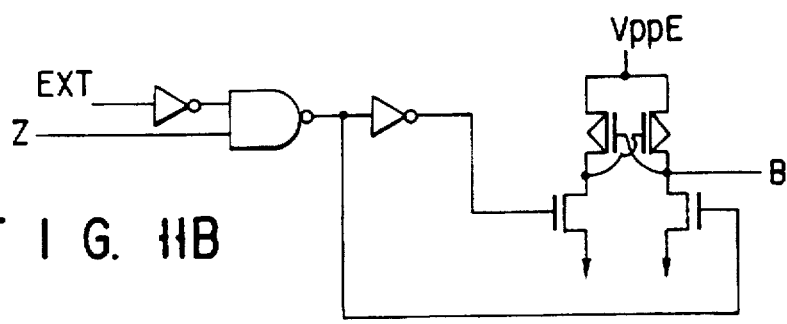
F I G. 11B
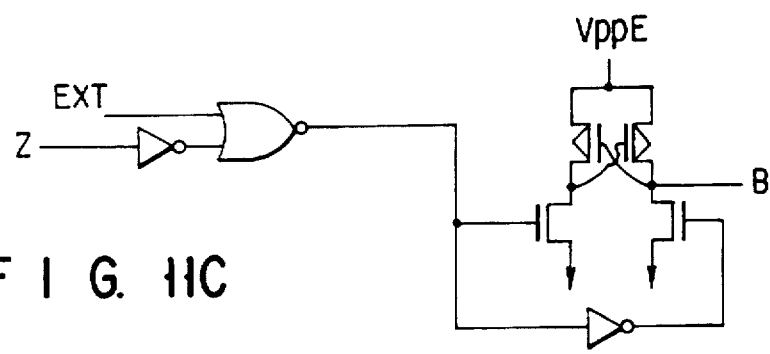
F I G. 11C
F I G. 12A
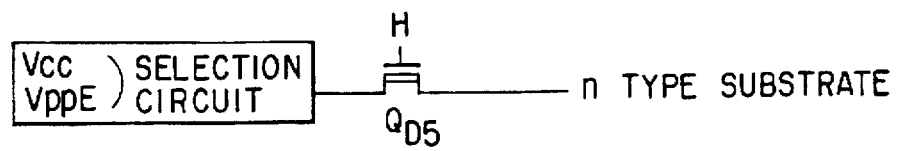
F I G. 12B
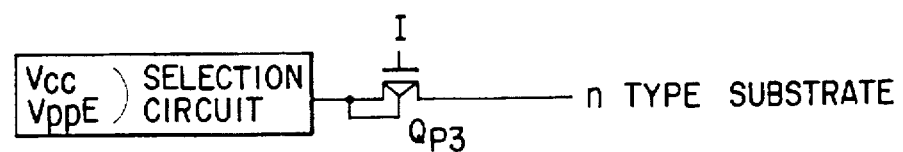
F I G. 12C

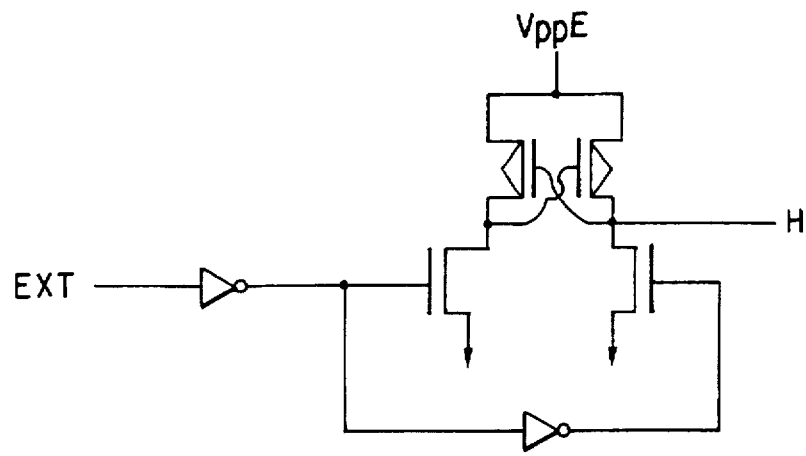
F I G. 12D
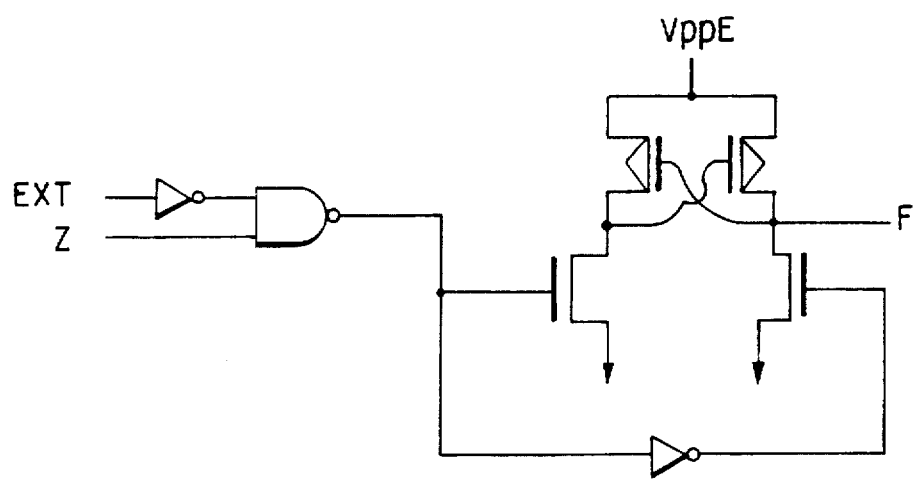
F I G. 12E
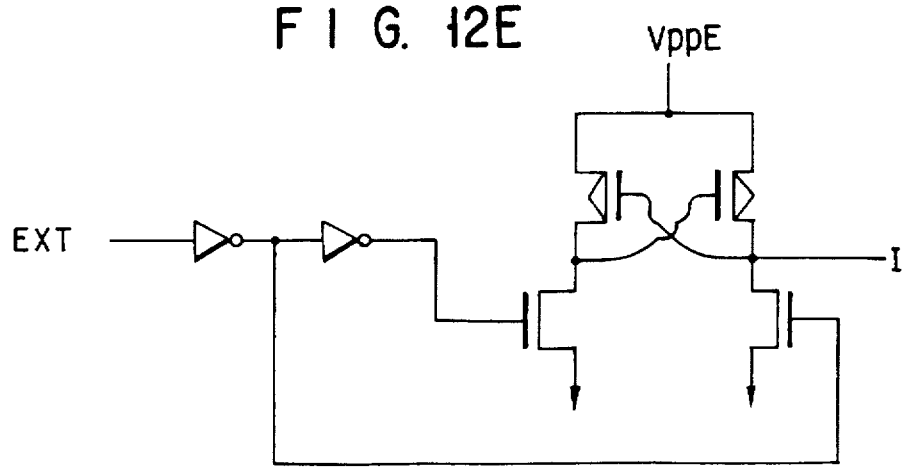
F I G. 12F

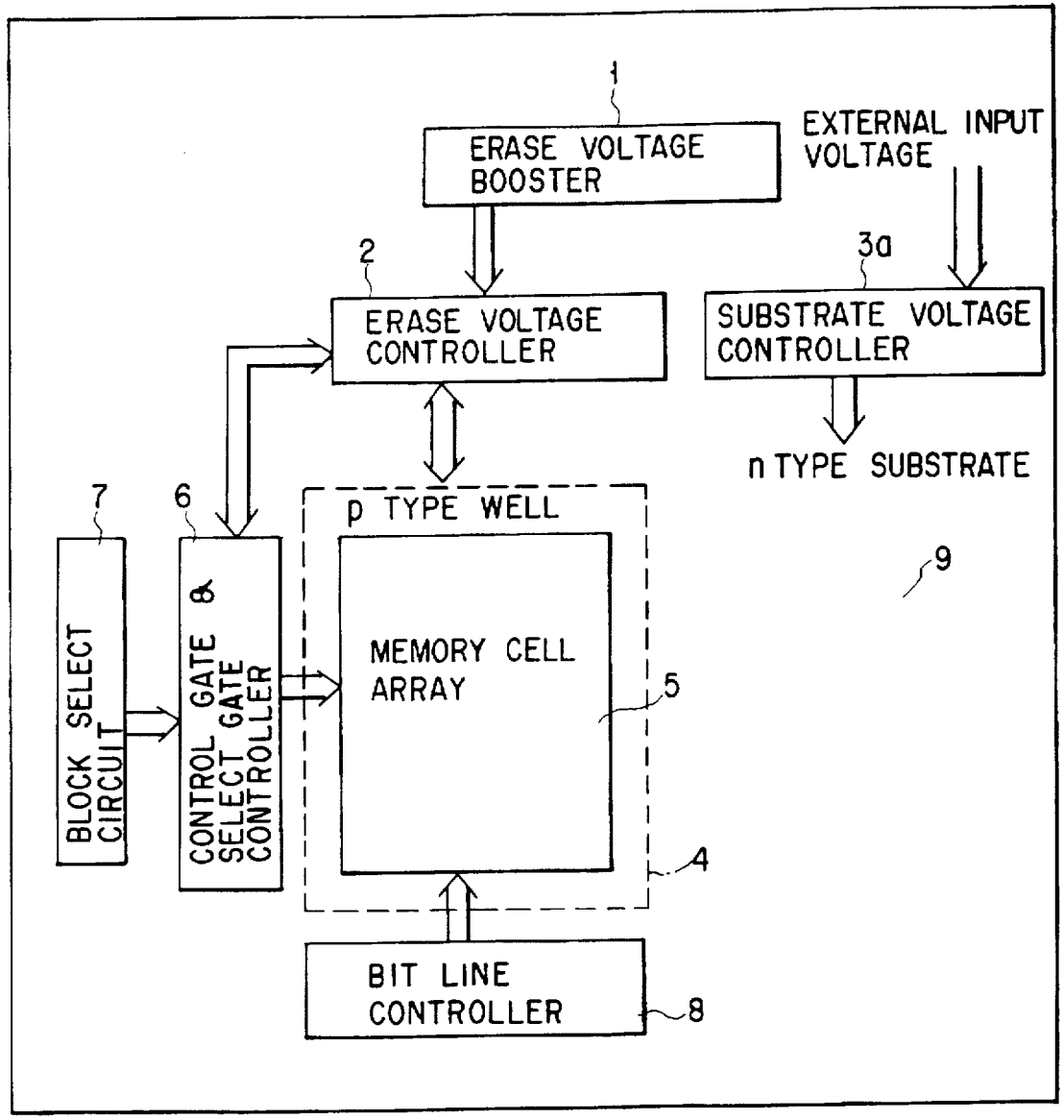
F I G. 13

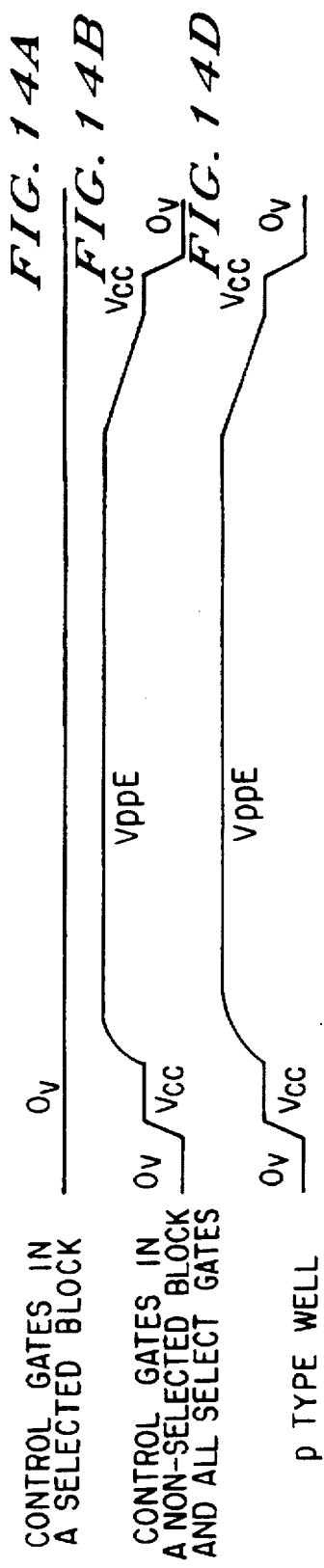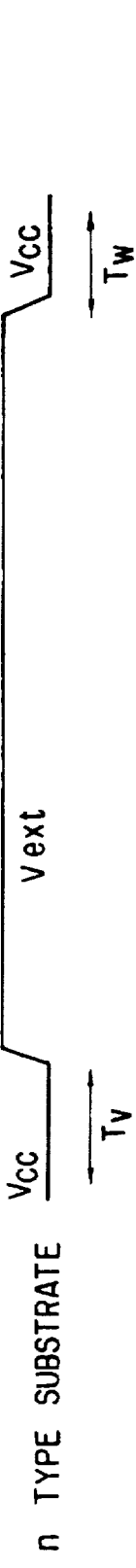

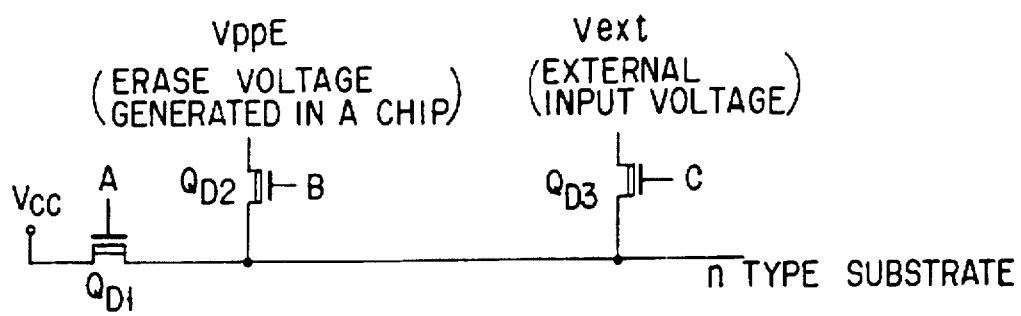
FIG. 16A
NORMAL (ONE CHIP) OPERATION
FIG. 16B p TYPE WELL 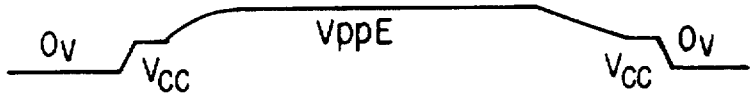
FIG. 16C A 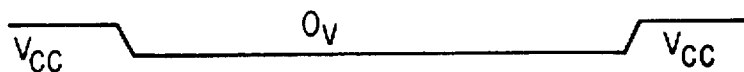
FIG. 16D B 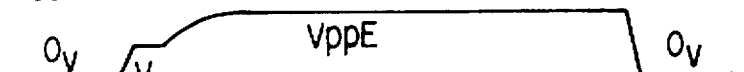
FIG. 16E C
FIG. 16F n TYPE SUBSTRATE 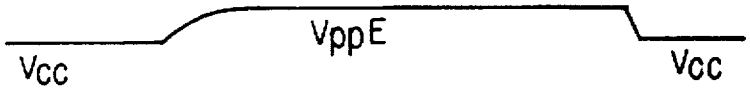
MULTI-CHIP OPERATION ON A WAFER
FIG. 16G p TYPE WELL 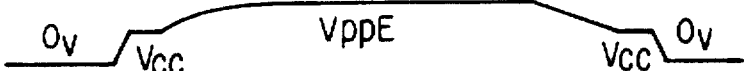
FIG. 16H A 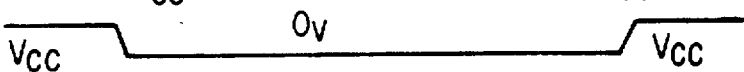
FIG. 16I B
FIG. 16J C 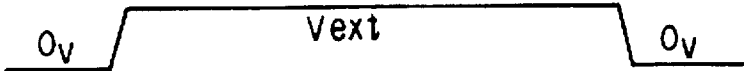
FIG. 16K n TYPE SUBSTRATE 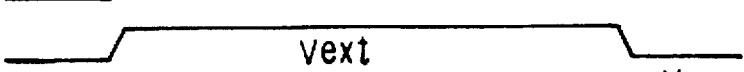

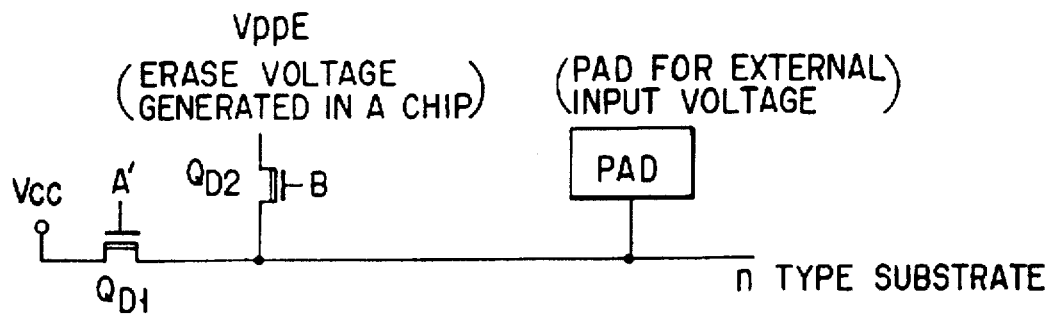
FIG. 17A
NORMAL (ONE CHIP) OPERATION
FIG. 17B  p TYPE WELL
FIG. 17C  A'
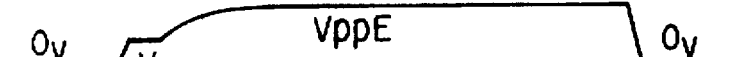
FIG. 17D  B
FIG. 17E  PAD
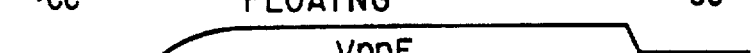
FIG. 17F  n TYPE SUBSTRATE
MULTI-CHIP OPERATION ON A WAFER
FIG. 17G  p TYPE WELL
FIG. 17H  A'
FIG. 17I  B
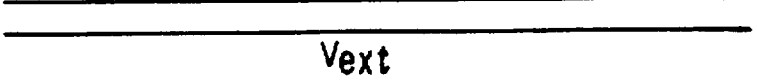
FIG. 17J  PAD
FIG. 17K  n TYPE SUBSTRATE

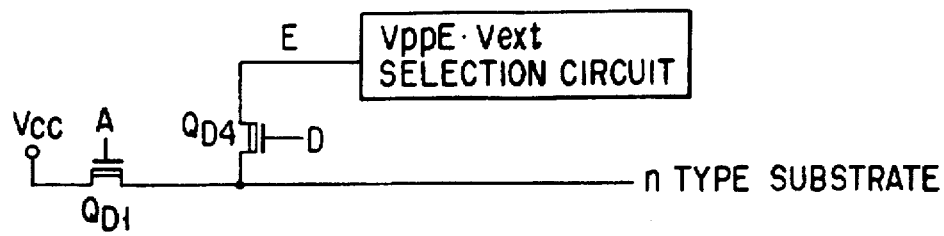
FIG. 18A
NORMAL (ONE CHIP) OPERATION
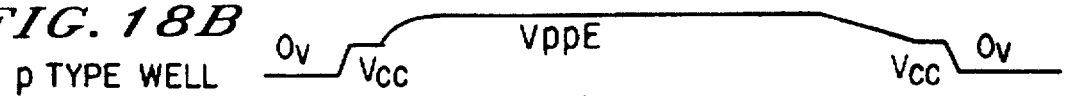
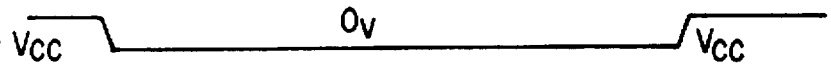
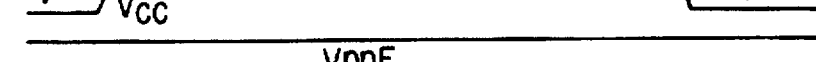
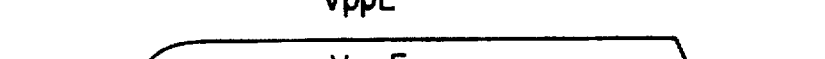
MULTICHIP OPERATION ON A WAFER
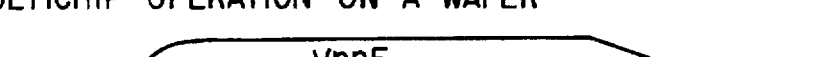
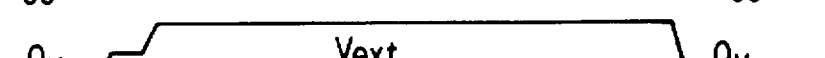
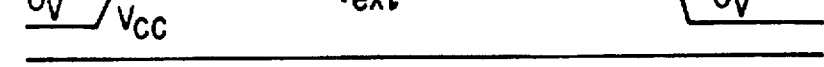

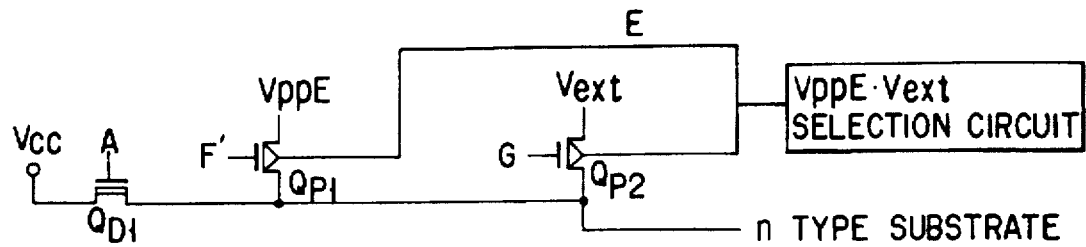
FIG. 19A
NORMAL (ONE CHIP) OPERATION
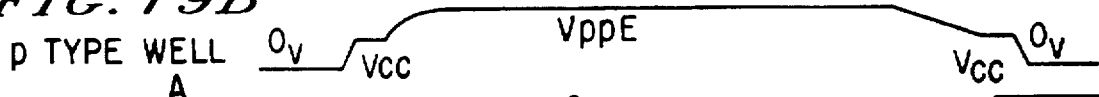
FIG. 19B p TYPE WELL
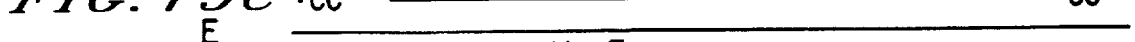
FIG. 19C A
FIG. 19D E
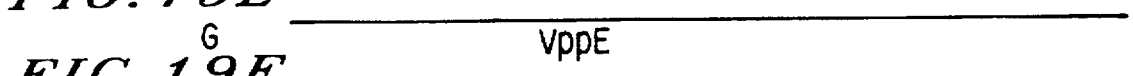
FIG. 19E F'
FIG. 19F G
FIG. 19G n TYPE SUBSTRATE
MULTICHIP OPERATION ON A WAFER
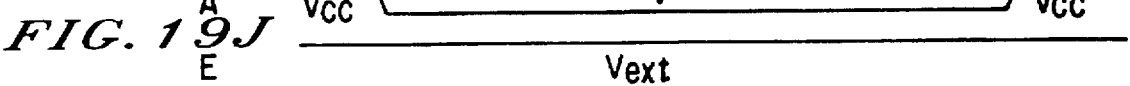
FIG. 19H p TYPE WELL
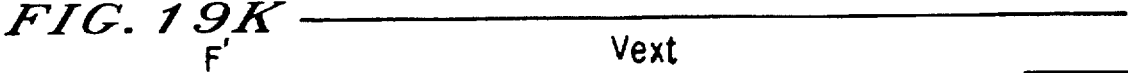
FIG. 19I A
FIG. 19J E
FIG. 19K F'
FIG. 19L G
FIG. 19M n TYPE SUBSTRATE

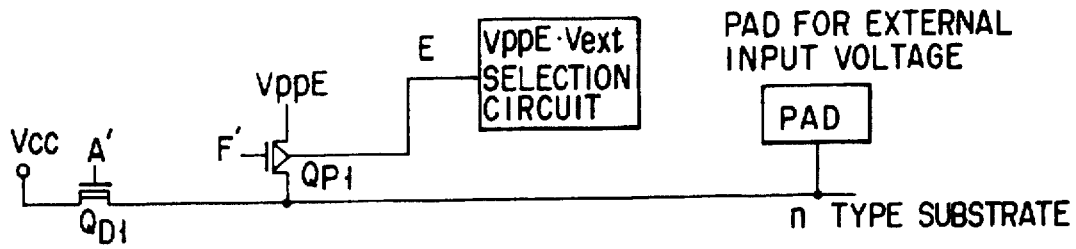
F I G. 20A
NORMAL (ONE CHIP) OPERATION
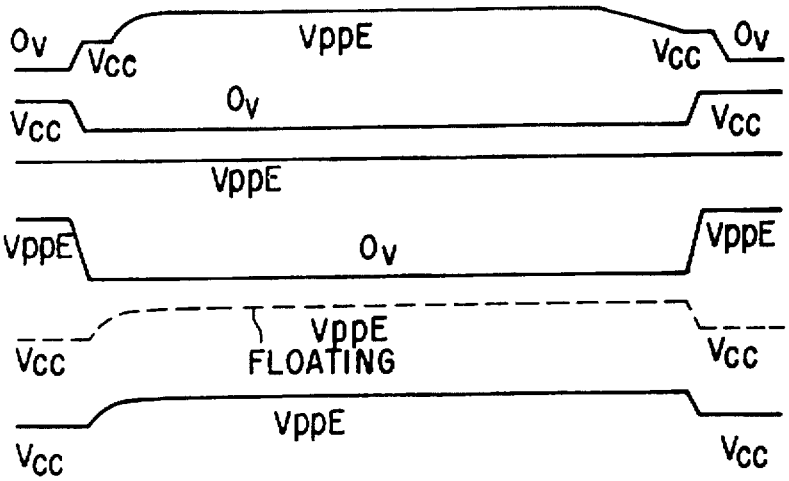
MULTI CHIP OPERATION ON A WAFER
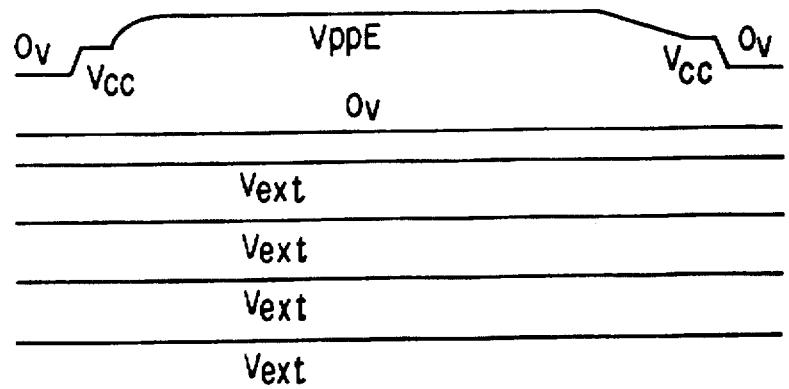

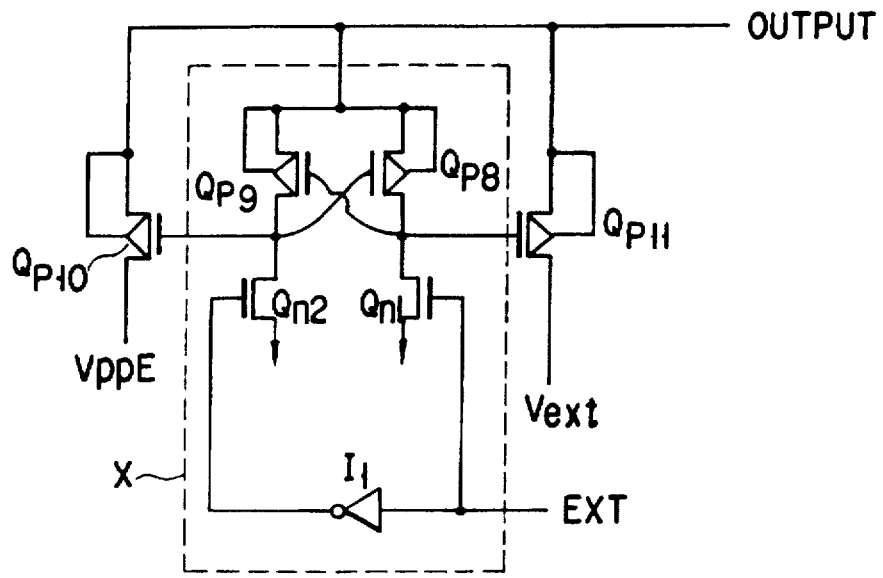
F I G. 21A
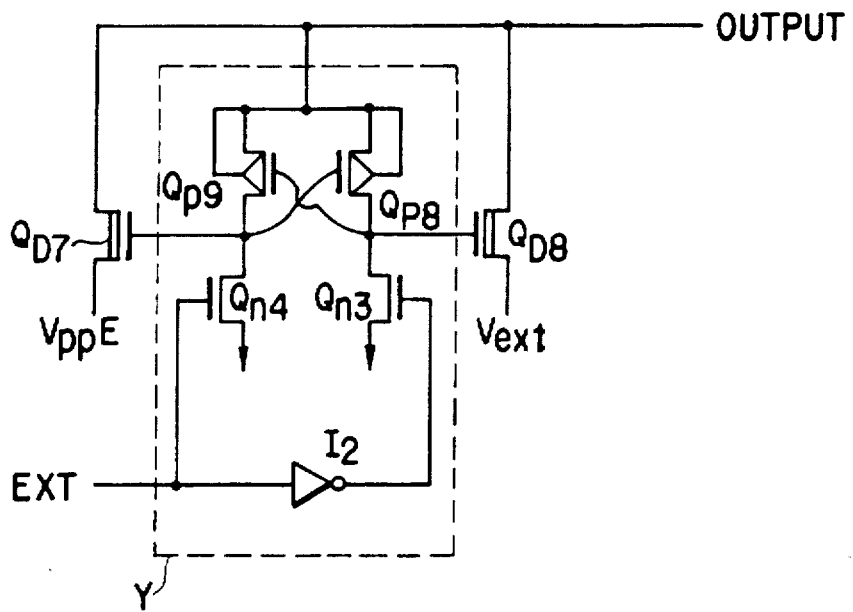
F I G. 21B

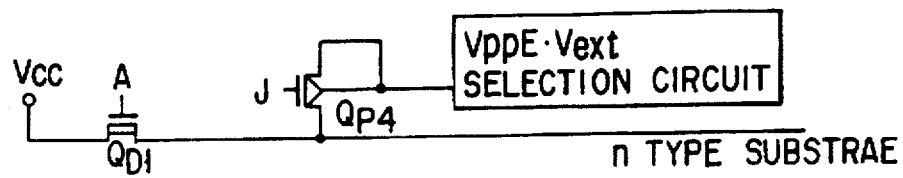
FIG. 22A
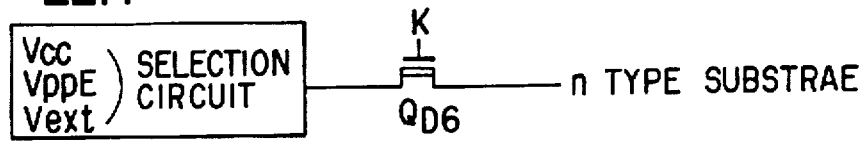
FIG. 22B
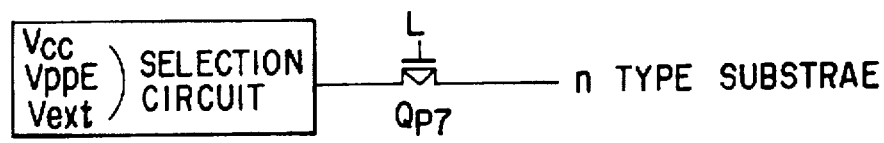
FIG. 22C
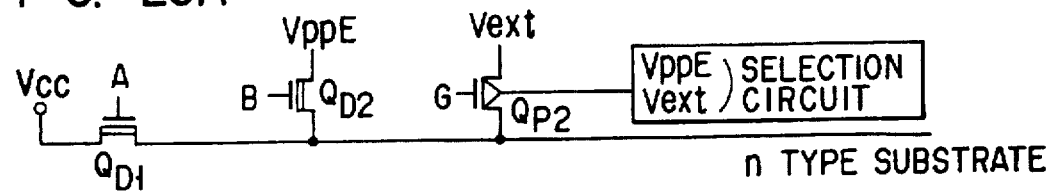
FIG. 23A
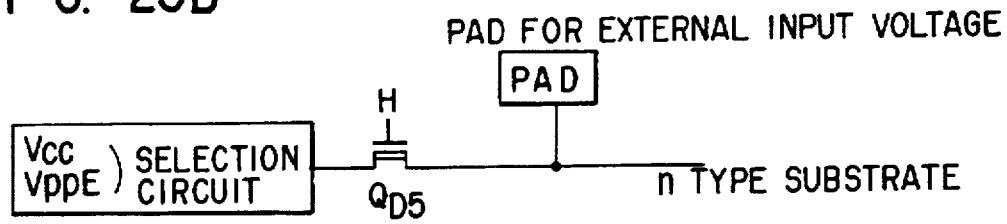
FIG. 23B
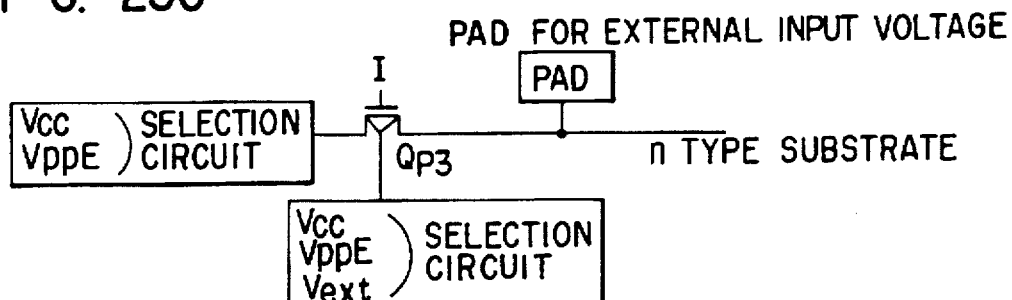
FIG. 23C
FIG. 23D

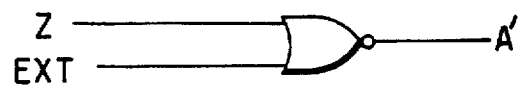
F I G. 24
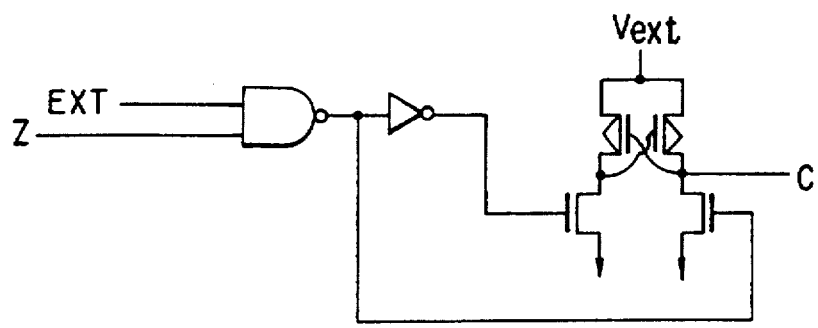
F I G. 25A
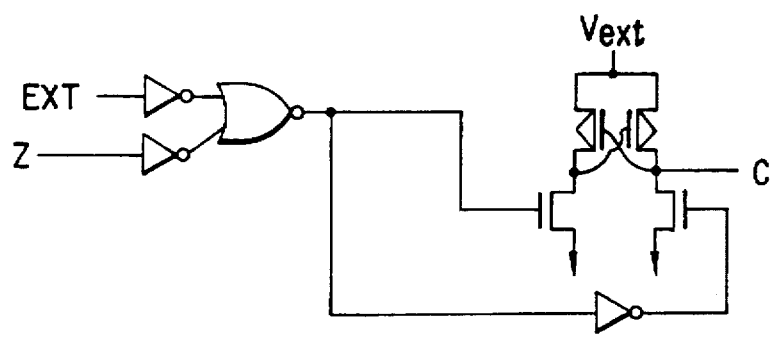
F I G. 25B
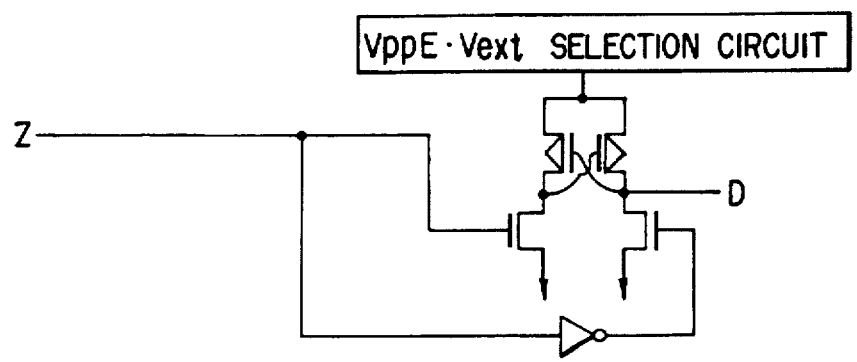
F I G. 26

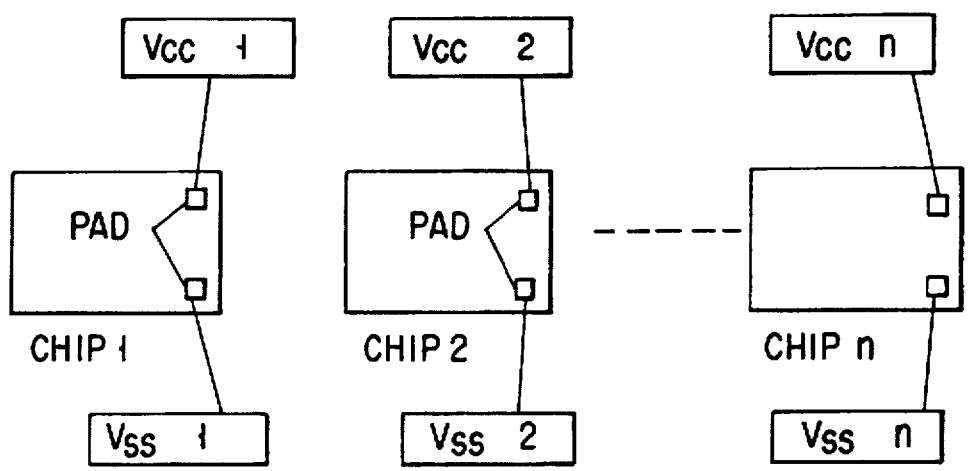
F I G. 29A
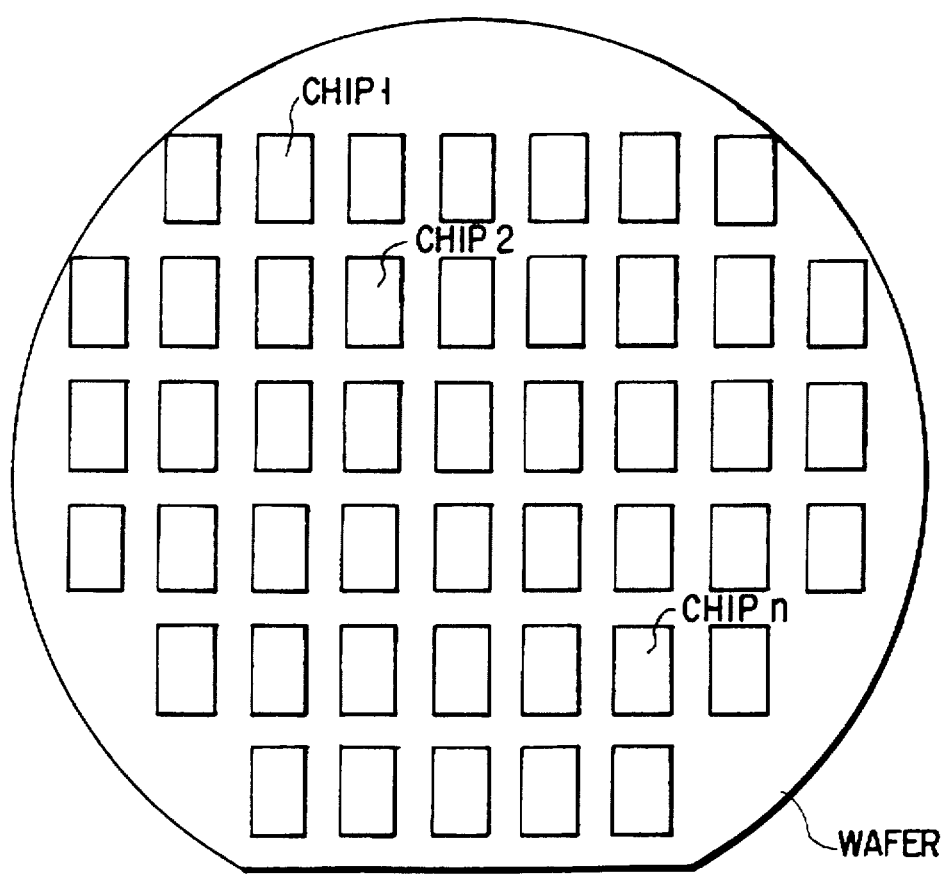
F I G. 29B

SEMICONDUCTOR MEMORY DEVICE

This application is a Continuation of application Ser. No. 08/309,425, filed on Sep. 20, 1994, now abandoned.

BACKGROUND OF THE INVENTION

1. Field of the Invention

This invention relates to an electrically erasable programmable semiconductor memory device, and more particularly to a semiconductor memory device with improved substrate-biasing means.

2. Description of the Related Art

NAND-cell EEPROMs capable of high integration have been known as one type of electrically erasable programmable nonvolatile semiconductor memory devices (EEPROMs). The NAND-cell EEPROM is composed of a plurality of memory cells, which are connected in series in such a manner that the source and drain of each cell are shared by the adjacent ones one after another, and which are treated as a unit connected to a bit line. The memory cell normally has an FETMOS structure in which a floating gate acting as a charge storage layer and a control gate are stacked in that order. The memory cell array is formed integrally in a p-well formed in an n-type substrate. The drain side of the NAND cell is connected to a bit line via a select transistor, and its source side is connected to a source line (a reference potential wire) via a select transistor. The control gate of each memory cell is connected to a lead wire (a control gate line), which serves as a word line.

The operation of the NAND-cell EEPROM is as follows. Data is written into the memory cells one by one, starting with the farthest one from the bit line. A high voltage Vpp (nearly 20 V) is applied to the control gate of the selected memory cell, whereas a medium voltage VppM (nearly 10 V) is applied to the control gates of the memory cells closer to the bit line than the selected memory cell and the gates of the select transistors. The bit line is applied with 0 V or the medium voltage according to the data. When 0 V is applied to the bit line, the potential is transmitted to the drain of the selected memory cell, which injects electrons into the floating gate. This shifts the threshold value of the selected memory cell in the positive direction. This state is assumed to be data "0", for example. When a medium potential is applied to the bit line, electron injection does not take place, so that the threshold value remains unchanged, staying negative. This state is assumed to be data "1."

The erasing of data is effected simultaneously for all memory cells in the NAND cell. Specifically, with all control gates and the gates of the select transistors at 0 V, and the bit line and the source line in the floating state, a high voltage of 20 V is applied to the p-well and the n-type substrate. This causes the electrons in the floating gate of each memory cell to be released into the p-well, thus shifting the threshold value in the negative direction.

The reading of data is performed by placing the control gate of the selected memory cell at 0 V and the control gates of the other memory cells and the gates of the select transistors at the power supply potential Vcc (5 V), and by sensing whether or not a current flows through the selected memory cell.

There is a case where in order to shorten the time required to check and test conventional EEPROM chips, a plurality of chips on the same wafer are checked and tested simultaneously. It is assumed that one of the chips is defective, and that the high voltage Vpp of the defective chip has dropped from the original 20 V to 10 V because in the chip, the high voltage Vpp is short-circuited to the ground potential, or the high voltage Vpp is short-circuited to the power supply voltage Vcc. In this state, when the high voltage Vpp generated at a voltage booster (step-up circuit) in the chip is applied to the n-type substrate, all of the Vpp is connected to the n-type substrate. Since the chips are formed on the same n-type substrate, the Vpp is common to all of the chips, with the result that the potential drops to the Vpp of the short-circuited chip. Therefore, because the data cannot be erased from the remaining chips either, it is impossible to tell whether it is a defective chip or not.

As described above, in the case of ordinary NAND-cell EEPROMs, the presence of a defective chip, such as a chip with large leakage current, makes it impossible to simultaneously perform an erasing test on a plurality of chips on the same wafer. As a result, the time required to check and test chips cannot be shortened.

SUMMARY OF THE INVENTION

An object of the present invention is to provide a semiconductor memory device which allows a plurality of chips on the same wafer to undergo an erasing test simultaneously, even if a defective chip, such as a chip with large leakage current, is present on the same wafer, thereby shortening the time required to check and test the chips.

Another object of the present invention is to provide a semiconductor memory device with means for switching according to an external signal between a mode in which a plurality of chips on the same wafer are erased simultaneously and a mode in which only a single chip is allowed to operate.

To accomplish the foregoing objects, a semiconductor memory device according to a first aspect of the invention comprises: a first conductivity-type semiconductor substrate in which a second conductivity-type well is formed; a memory cell array composed of a plurality of memory cells arranged in a matrix in the second conductivity-type well; and a substrate voltage control circuit selectively outputting an output voltage to the substrate according to an external input signal.

Further, a semiconductor memory device according to a second aspect of the invention comprises: a first conductivity-type semiconductor substrate in which a second conductivity-type well is formed; a memory cell array composed of a plurality of memory cells arranged in a matrix in the second conductivity-type well; input means for at least a specified power supply voltage required for a normal operation; step-up means for generating a step-up power supply voltage from the specified power supply voltage; and a substrate voltage control circuit to which the specified power supply voltage and the step-up power supply voltage are supplied, and which selectively outputs an output voltage to the substrate according to an external input signal.

For example, when the substrate voltage control circuit controls not to output a voltage, the semiconductor substrate in a floating state is allowed to be charged with the well voltage applied to the second conductivity-type well. This enables the individual chips to be electrically separated from each other, even when a plurality of chips on the same wafer are to be erased and contain a defective one.

Additionally, by applying an external power supply voltage different from the specified power supply voltage to the semiconductor substrate via the external power supply voltage input section, the individual chips are electrically separated from each other, even when a plurality of chips on the same wafer are to be erased and contain a defective one.

Furthermore, a semiconductor memory device according to a third aspect of the invention comprises: a first conductivity-type semiconductor substrate in which a second conductivity-type well is formed; a memory cell array composed of a plurality of memory cells arranged in a matrix in the second conductivity-type well; input means for at least a specified power supply voltage required for a normal operation; step-up means for generating a step-up power supply voltage from the specified power supply voltage; input means for an external input power supply voltage different from the specified power supply voltage; and a substrate voltage control circuit to which the specified power supply voltage, the step-up power supply voltage, and the external input power supply voltage are supplied, and which selectively outputs the voltage to the substrate according to an external input signal.

The control means contains a transistor, whose source is connected to the substrate and whose drain is connected directly or via another transistor to any one of the voltages. The transistor becomes conductive or nonconductive according to the level of the external input signal, thereby applying or not applying any one of the voltages to the substrate.

With the present invention, by charging the substrate with an p-n junction forward current or applying a voltage supplied from outside the chip to the substrate, instead of directly applying to the substrate a step-up voltage generated in the chip, the voltage generated in each chip on the same wafer can be prevented from dropping, even if the chips on the wafer contain a defective one with a large leakage current. This enables a plurality of chips on the same wafer to undergo an erase operation simultaneously, for example. Thus, because a plurality of chips on the same wafer can be checked and tested simultaneously, the time required to check and test chips can be shortened remarkably.

Furthermore, because the mode in which a plurality of chips on the same wafer are erased at the same time is turned on by an external signal, it can be switched to a single-chip operation mode, when it is not desirable for the chips to be operated simultaneously, or when each packaged chip of a semiconductor memory device is tested. Therefore, this provides wide application.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, in which;

FIG. 6 is an equivalent circuit diagram of the memory cell portion of an ordinary NAND EEPROM;

FIG. 7 is a diagram to help give a general description of the block erasing operation in an ordinary NAND EEPROM;

FIGS. 8A to 8D is a timing chart to help explain the operation of the first embodiment;

FIGS. 10A to 10I are a circuit diagram of the substrate voltage control circuit of the first embodiment and the operation timing chart, respectively;

FIGS. 11A to 11C are circuit diagrams of signal generating means used in the substrate voltage control circuit of the first embodiment;

FIGS. 12A to 12F are circuit diagrams of signal generating means used in another substrate voltage control circuit of the first embodiment;

FIG. 13 is a schematic block diagram of a NAND-cell EEPROM according to a second embodiment of the present invention;

FIGS. 14A to 14D is a timing chart to help explain the operation of the second embodiment;

FIGS. 15A to 15D is a timing chart to help explain the operation of a modification of the second embodiment;

FIGS. 16A to 16K are a circuit diagram of the substrate voltage control circuit of the second embodiment and a timing chart to help explain its operation, respectively;

FIGS. 17A to 17K are a circuit diagram of the substrate voltage control circuit of a modification of the second embodiment and a timing chart to help explain its operation, respectively;

FIGS. 18A to 20M are circuit diagrams of still other modifications of the substrate voltage control circuit of the second embodiment and timing charts to help explain their operation;

FIGS. 21A and 21B are examples of the VppE/Vext selection circuit;

FIGS. 22A to 22C are circuit diagrams of other substrate voltage control circuits of the second embodiment;

FIGS. 23A to 23D are circuit diagrams of still other substrate voltage control circuits of the second embodiment;

FIG. 24 is a circuit diagram of a circuit for producing signal A';

FIGS. 25A and 25B are circuit diagrams of circuits for producing signal C;

FIG. 26 is a circuit diagram of a circuit for producing signal D;

FIGS. 29A and 29B are diagrams to help explain an example of the present invention being applied to the measurement of drawn currents.

DETAILED DESCRIPTION OF THE PREFERRED EMBODIMENTS

Hereinafter, referring to the accompanying drawings, embodiments of the present invention will be explained.

Figure 1:
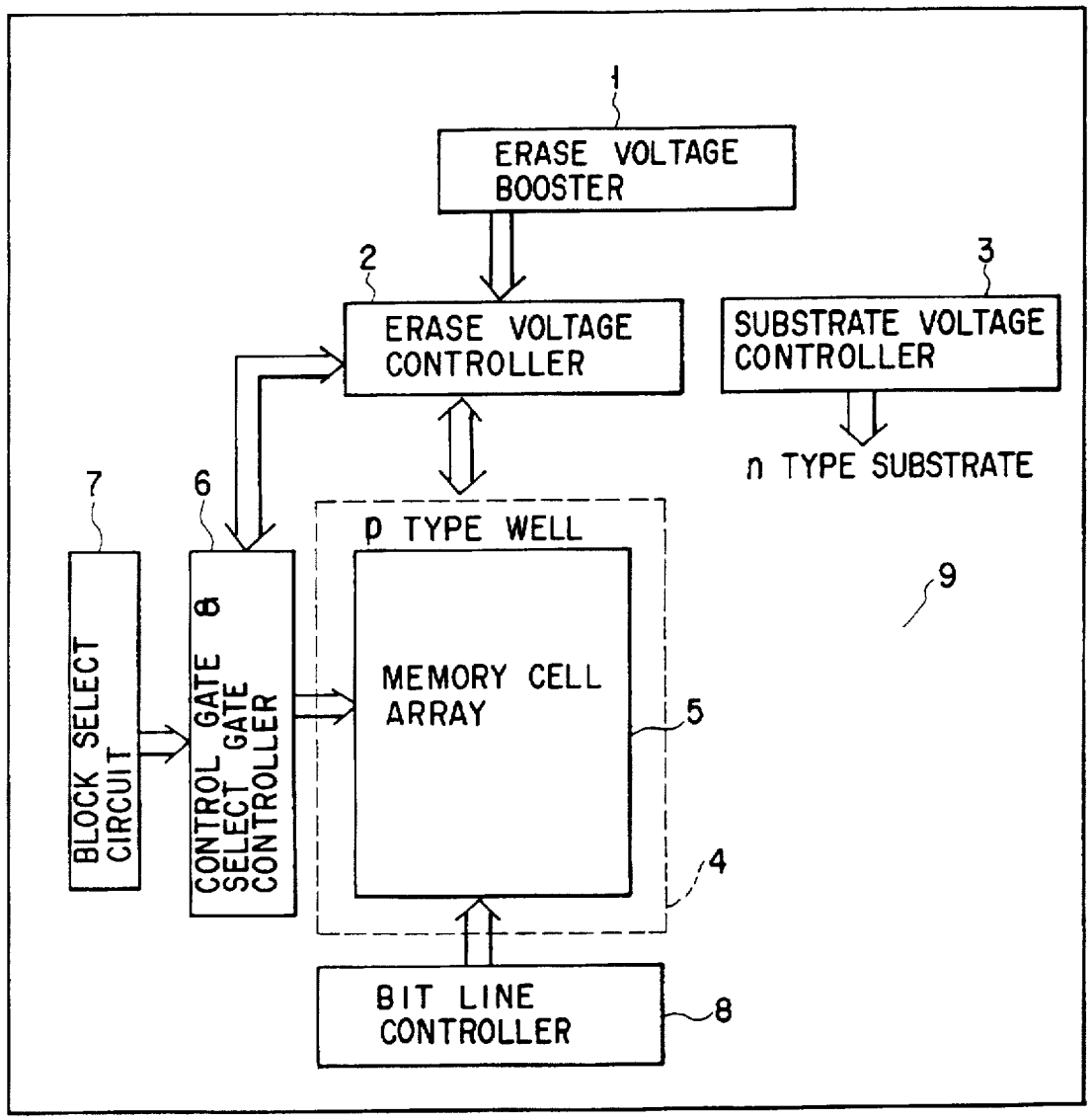
FIG. 1 is a schematic block diagram of a NAND EEPROM according to a first embodiment of the present invention.

FIG. 1 is a schematic block diagram of a NAND-cell EEPROM according to a first embodiment of the present invention. The schematic block diagram is also a plan view of the memory chip. FIG. 1 only shows a portion related to data erasing, omitting a control circuit section for controlling the operation of writing and reading data. In FIG. 1, numeral 1 indicates an erase voltage booster (step-up circuit), 2 an erase voltage controller, 3 a substrate voltage controller, 4 a p-well, 5 a memory cell array, 6 a control gate and select gate controller, 7 a block select circuit, and 8 a bit line controller.

The memory cell array 5 is formed in the p-well 4 formed in an n-type silicon substrate 9 as explained in detail later. The memory cell array 5 is provided with the block select circuit 7 for performing block erasing. The control gate and select gate controller 6 is provided to give the erase voltage from the erase voltage controller 2 to the control gate and select gate in each NAND cell block according to the output of the block select circuit 7.

An erase voltage is produced by the erase voltage step-up circuit 1. The erase voltage from the erase voltage step-up circuit 1 is supplied to the select gate of each NAND cell and the control gates of the unselected blocks via the erase voltage controller 2 and the control gate and select gate controller 6. The potential of the n-type substrate 9 is controlled by the substrate voltage controller 3. The bit line controller 8 operates at the time of writing and reading data, and is disconnected from the memory cell array 5 at the time of data erasing.

Figure 2:
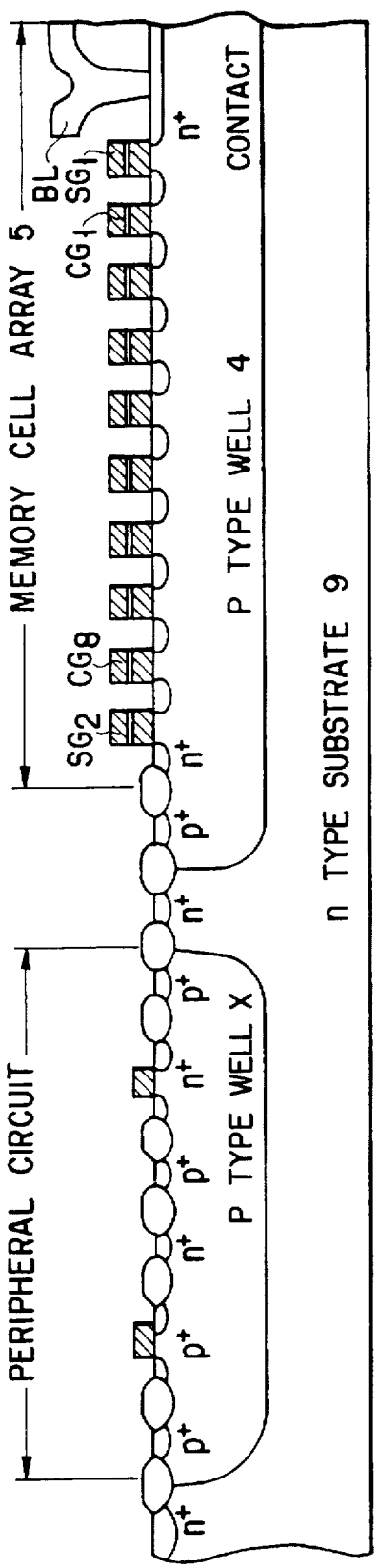
FIG. 2 is a sectional view of a major portion of the NAND EEPROM of FIG. 1.

FIG. 2 is a schematic sectional view of a major portion of the memory chip. In the p-well 4 formed in the n-type substrate 9, the memory cell array 5 is formed, and a peripheral circuit is formed in another p-well X.

Figure 5:
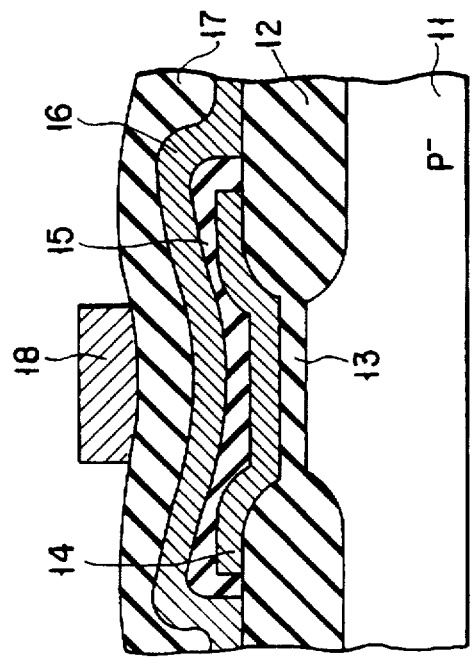
FIG. 5 is a sectional view taken along line V—V of FIG. 3A.
Figure 4:
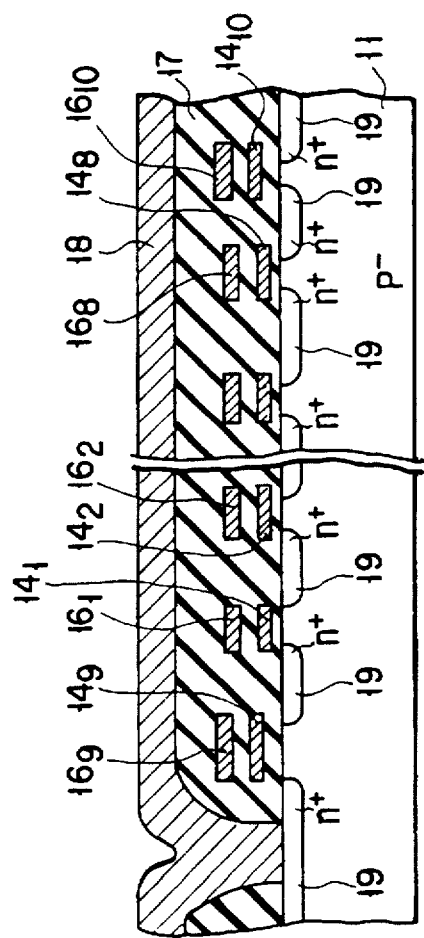
FIG. 4 is a sectional view taken along line IV—IV of FIG. 3A.
Figure 3A:
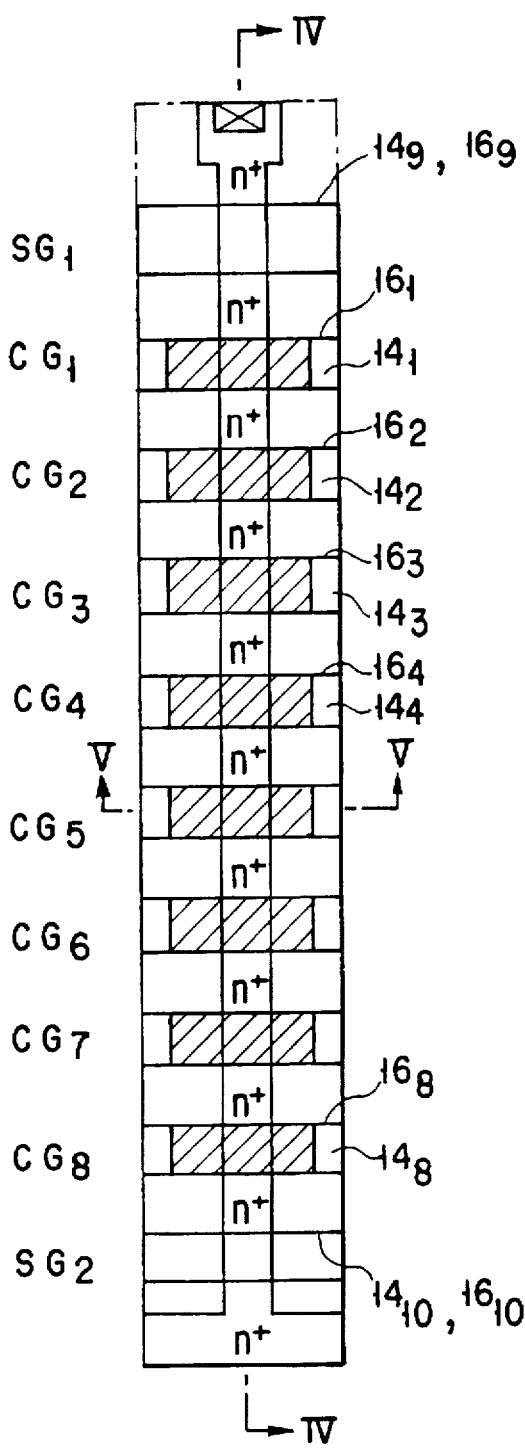
FIGS. 3A and 3B are a schematic plan view and an equivalent circuit diagram of the memory cell portion of an ordinary NAND EEPROM, respectively.
Figure 3B:
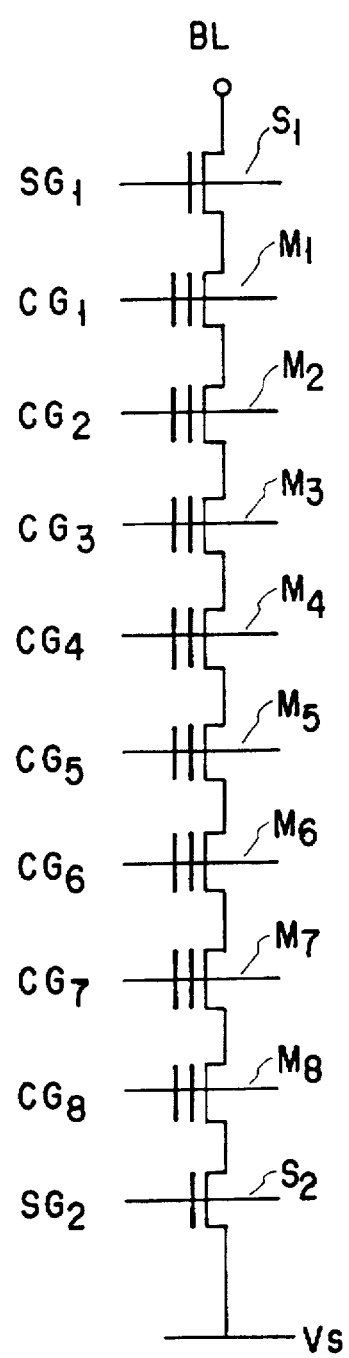

FIGS. 3A and 3B are a plan view and an equivalent circuit of a single NAND cell portion of the memory cell in the embodiment, respectively. FIGS. 4 and 5 are sectional views taken along line IV—IV and line V—V of FIG. 3A, respectively. In FIGS. 4 and 5, however, the n-type silicon substrate is not shown, and the cross section of the p-well 11 (indicated by numeral 4 in FIG. 1) formed in the substrate is shown. As shown in FIG. 5, a NAND cell is formed in the region marked off by an element isolating insulating film 12 in the p-well 11.

As shown in FIGS. 3A and 3B, a single NAND cell is composed of eight memory cells $M_1$ to $M_8$ in the embodiment. In each of the memory cells $M_1$ to $M_8$, as shown in FIG. 4, a floating gate 14 ($14_1$ to $14_8$) is formed of a first-layer polysilicon film via a thin gate insulating film 13 formed by thermal oxidation on the p-well 11. Above the floating gate, a control gate 16 ($16_1$ to $16_8$) is formed of a second-layer polysilicon film via an interlayer insulating film 15. The floating gate 14 is a charge storage layer.

To the control gate 16 of each memory cell, a control gate line CG ($CG_1$ to $CG_8$) is connected in the direction perpendicular to an array of memory cells arranged in a row. The control gate line normally acts as a word line. The eight memory cells $M_1$ to $M_8$ are connected in series in such a manner that the n-type layers 19 acting as the source and drain diffusion layers of the memory cells are shared by adjacent cells. The drain side and source side of the series connection of eight memory transistors are provided with select transistors S1 and S2, respectively. The gate insulating films of those select transistors are generally formed separately from and thicker than the memory cell portion. On these gate insulating films, two layers of gate electrodes $14_9$, $16_9$ and $14_{10}$, $16_{10}$ are formed at specific intervals so as to be isolated from each other. The gate electrodes of these two layers make contact with each other in another place (not shown) and are connected to select gate lines $SG_1$ and $SG_2$ placed in parallel with the control gate line CG.

The substrate on which elements are formed is covered with a CVD insulating film 17, on which a bit line 18 is provided. The bit line 18 is in contact with the drain diffusion layer of one select transistor $S_1$. The source diffusion layer of the other select transistor $S_2$ is normally connected to a common source line common to a plurality of NAND cells. FIG. 6 shows an equivalent circuit of a memory cell array in which such NAND cells are arranged in a matrix. In FIG. 6, BL indicates a bit line.

A general description of block erasing in the embodiment will be given with reference to FIG. 7. A memory cell array is made up of a plurality of NAND cell blocks 20 ($20_1$ to $20_n$) as shown in FIG. 7. It is assumed that the first NAND cell block $20_1$ and the second NAND cell block $20_2$ are selected in the erase mode, starting from the top. Then, an erase voltage VppE (=20 V) is applied to a p-well in which a memory cell array is formed, and at the same time, 0 V is applied to all of the control gates CG in the selected NAND cell blocks $20_1$ and $20_2$. Then, the erase voltage VppE is applied to the gates SG of all select transistors in the selected NAND cell blocks and the unselected NAND cell blocks, and to all of the control gates CG in the unselected NAND cell blocks. All of the bit lines are brought into a floating state.

As a result, the electrons in the floating gates of all memory cells in the selected NAND cell blocks $20_1$ and $20_2$ are released into the p-well, thereby erasing the data from the blocks $20_1$ and $20_2$. By placing all blocks in the chip at the voltage of the selected blocks, the data can be erased from the chip in a similar manner.

When the data is erased from the block or the chip as described above, the voltage at each portion of the memory cell behaves as shown in FIG. 8. P TYPE WELL in FIG. 8 means the voltage at the p-well in which the memory cell is formed.

Before an erase operation, all control gates CG, select gates SG, and p-wells are fixed at 0 V and the n-type substrate is fixed at Vcc. When an erase operation starts, the voltages of the control gates CG, select gates SG, and p-wells in the unselected blocks are raised from 0 V to Vcc. Then, the control gates CG, select gates SG, and p-wells in the unselected blocks are charged to the output voltage VppE (up to 20 V) of the erase voltage booster 1 of FIG. 1, which state is kept for a while, thereby erasing the data from the memory cells. Then, the voltages of the control gates CG, select gates SC, and p-wells in the unselected blocks are lowered from VppE to nearly Vcc. After that, they are discharged further to 0 V, which completes the erase operation. The control gates CG in the selected blocks are kept at 0 V during the erasing operation.

In such an operation, the voltage at the n-type substrate is prevented from being outputted from the substrate voltage controller 3 of FIG. 1 only during a period of Ts in FIG. 8. That is, the n-type substrate is brought into a floating state only during a period of Ts. As a result, when the voltage at the p-well rises from Vcc to VppE, the p-n junction of the p-well and n-type substrate is forward-biased, which allows the n-type substrate to be charged with the forward current from the p-well, producing a voltage of (VppE−Vj). Here, Vj is the forward voltage drop at the p-n junction of the p-well and n-type substrate and generally fulfills the condition: Vj>0. After the voltage at the p-well has dropped to nearly Vcc, the substrate voltage controller 3 starts outputting the n-type substrate voltage, which is fixed at Vcc.

The timing with which the n-type substrate is brought into a floating state may be arbitrary provided that it is before the voltage at the p-well has changed from Vcc to VppE. That is, within the period of Tt, timing may be arbitrary. The timing with which the n-type substrate is returned from the floating state to Vcc may be arbitrary provided that it is within the period of Tu.

The semiconductor memory device of the embodiment is especially effective in the following case. When inspection of products to sort out defectives from nondefectives and a reliability test are carried out in a factory before shipment, a plurality of chips on the same wafer are checked and tested simultaneously in order to improve the efficiency of the inspection and test (speed up the inspection and test). In the case of an erase test in the prior art, the substrate voltage is common to the chips. Thus, when a defective chip, such as a chip with a leakage problem, is present, this causes the substrate voltage to drops, making it impossible to test all chips.

Figure 9A:
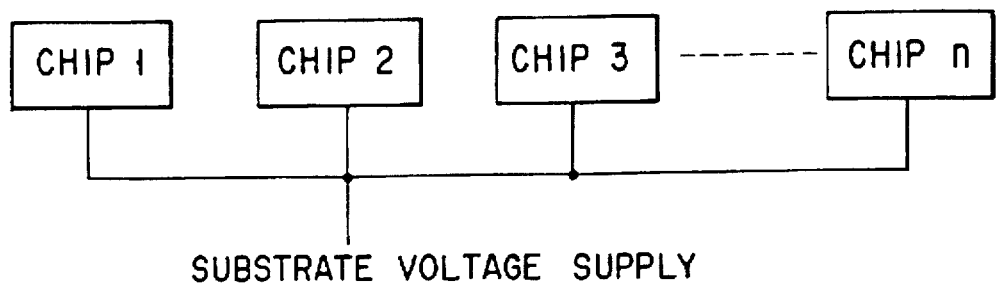
FIGS. 9A and 9B are conceptual diagrams of the arrangement of a plurality of chips on the same wafer and the connections of substrate voltages.
Figure 9B:
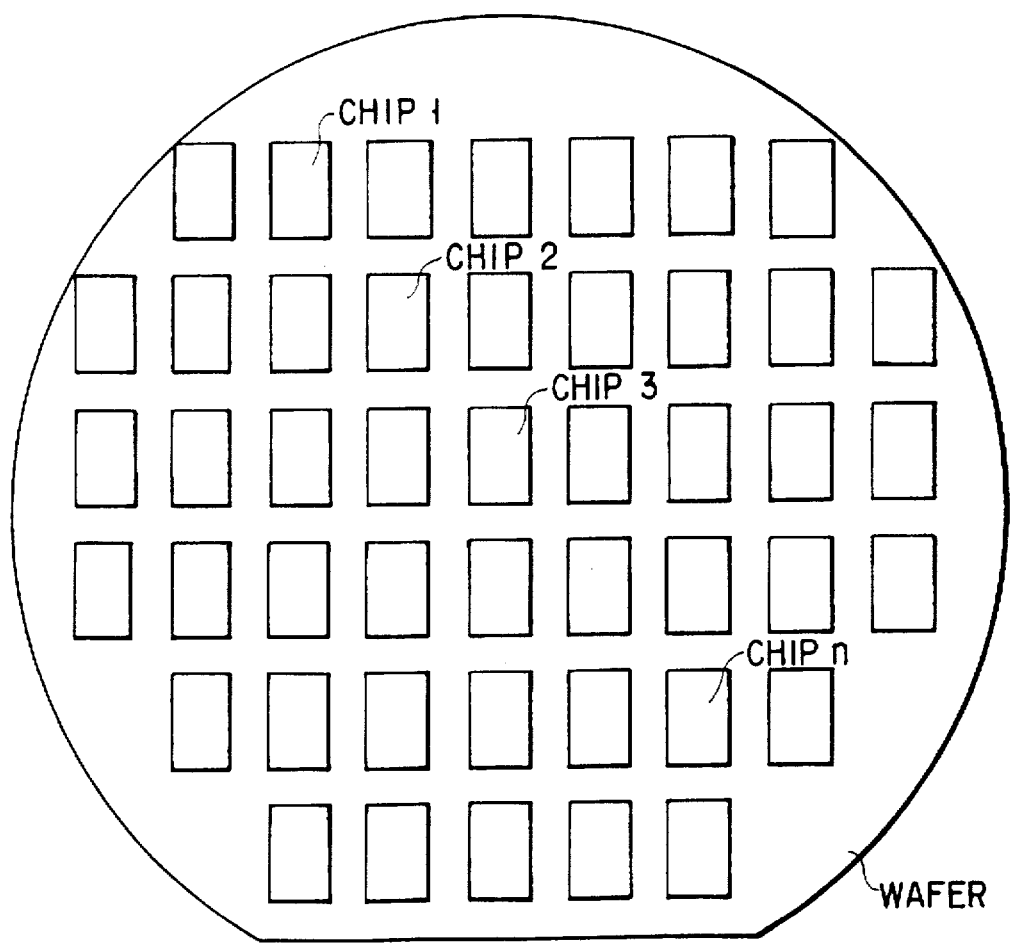

This state is shown in FIGS. 9A and 9B. FIG. 9A shows that a plurality of chips on the same wafer are connected to a common substrate voltage. FIG. 9B shows an arrangement of a plurality of chips on the wafer, where chips CHIP1 to CHIPn whose substrate voltage is equal are tested simultaneously. It is assumed that the chips contains a defective one and that in the defective chip, the voltage VppE is short-circuited to the ground potential or the voltage Vcc, and consequently the voltage VppE drops from the original 20 V to nearly 10 V. When only CHIP2 is defective in FIG. 9A, use of a conventional erasing method allows the voltage VppE generated at the step-up circuit in the chip to be applied to the n-type substrate, thus causing the VppEs of all of CHIP1 to CHIPn to be connected to the n-type substrate. Since the plurality of chips are formed on the same n-type substrate, VppE is common to CHIP1 to CHIPn. As a result, the voltage VppE leaks at the short-circuited portion of CHIP2, permitting the VppEs of all of CHIP1 to CHIPn to drop. Consequently, the data cannot be erased from the memory cells not only in defective CHIP2 but also in the remaining CHIPs, thus making it impossible to sort out the defective one.

As described above, with a conventional NAND-cell EEPROM, the presence of a defective chip, such as a chip with large leakage current, makes it impossible to simultaneously put a plurality of chips on the same wafer to an erasing test. As a result, the time required for the inspection and test cannot be shortened.

With the first embodiment, however, the voltage VppE and substrate voltage of each chip are connected to each other only through the p-n junction of the p-well and the n-type substrate. Therefore, even in the case of the configuration shown in FIGS. 9A and 9B, if the highest of the VppEs of CHIP1 to CHIPn is (VppE)max, the substrate voltage will be charged to a voltage of [(VppE)max−Vj]. Even if the p-well in CHIP2 has been charged to about 10 V, this will only bias the p-n junction in the reverse direction of the n-type substrate charged to about 20 V, without an adverse effect. In this way, all of the VppEs of CHIP1 to CHIPn will be separated from each other, making it possible to distinguish a defective chip from nondefective ones.

As described above, with the present invention, a plurality of chips on the same wafer can be simultaneously put to the sorting out of defectives from nondefectives in the erase mode or to a reliability test.

While in the embodiment, the way of applying a bias to the n-type substrate in an erase operation has been explained, a biasing method may be changed according to the way of operating chips on the same wafer. For example, a conventional method may be used to operate a single chip, and the first embodiment may be used only when a plurality of chips on the same wafer are operated.

FIGS. 10A and 10B are a circuit diagram of a substrate voltage controller which uses the first embodiment when a plurality of chips on the same wafer are operated, and a conventional system in the case of other normal operations (a single chip operation), and an operation timing chart, respectively. In FIG. 10A, transistors $QD_1$ and $QD_2$ are both n-channel D-type (depletion type) transistors, whose threshold voltage is higher than (−Vcc) and lower than 0 V even when a back bias of (−VppE) is applied.

From the operation timing shown in FIG. 10B, it can be seen that only during the operation of a plurality of chips on the same wafer, when the voltage at the p-well is at VppE, both $Q_{D1}$ and $Q_{D2}$ are inactive and consequently the substrate voltage controller produces no voltage output. This prevents the VppEs of the other chips from dropping even if any one of the chips is defective and produces a large leakage current, making it possible to check and test a plurality of chips in the erase mode simultaneously.

To realize the above-described timing, how to generate signals A and B in FIG. 10 will be explained. FIGS. 11A to 11C are circuit diagrams of generating circuits of signals A and B. In FIG. 10, signal Z is a signal generated in the chip for switching to the erase mode. It is assumed to go from low to high when the erase mode is turned on. FIG. 11A shows that signal A is the reverse of signal Z.

FIGS. 11B and 11C are generating circuits of signal B. Signal EXT is an external input signal, which is an externally supplied signal for indicating either a normal (single chip) operation or a multiple chip simultaneous operation, and is given prior to erase mode signal Z. It goes high when a plurality of chips on the same wafer operate, and it goes low in a normal operation. With the external input signal EXT is present, when the erase mode signal Z (of a high level) is inputted, either VppE or 0 V is outputted at terminal B, depending on whether the external signal EXT is low or high.

FIGS. 12A to 12C show other circuit diagrams of the substrate voltage controller. Generating circuits of signals H, F, and I necessary for these circuits are shown in FIGS. 12D to 12F. FIG. 12A shows an example of using a p-channel transistor QP1 as a transistor inserted between VppE and the n-type substrate. FIGS. 12B and 12C are examples of selecting Vcc and VppE in advance at a selection circuit and connecting them to the n-type substrate via a D-type transistor $Q_{D5}$ or a p-channel transistor $Q_{P3}$. An example of the selection circuit will be explained later.

Hereinafter, a NAND-cell EEPROM according to a second embodiment of the present invention will be explained. FIG. 13 is a schematic block diagram of the second embodiment. The same parts as those in FIG. 1 will be indicated by the same reference symbols, and their detailed explanation will be omitted. The second embodiment differs from the first embodiment in that a substrate voltage controller 3a is supplied with a voltage (a voltage rising above VppE when in an erase operation) from outside the chip.

The operation of the second embodiment will be explained with reference to FIG. 14. Because the voltages of the control gate CG in the selected block, the control gate CG in the unselected block, the select gates SG, and the p-well operate in the same manner as in FIG. 8, their explanation will be omitted. The potential of the n-type substrate is fixed to Vcc before an erase operation. When the p-well is charged from Vcc to VppE, the n-type substrate is charged from Vcc to Vext (where Vext is an external input voltage and fulfills the condition: Vext≧VppE). Then, after the voltage at the p-well has dropped to a voltage of nearly Vcc, the voltage at the n-type substrate drops from Vext to Vcc.

In FIG. 14, the timing of changing the voltage at the n-type substrate from Vcc to Vext, or from Vext to Vcc is arbitrary as long as it is in the range determined by Tv and Tw. As a modification of the second embodiment, the n-type substrate may, of course, be fixed at Vext before an erase operation starts as shown in FIG. 15. The Vext in FIGS. 14 and 15 does not necessarily fulfill the condition of VppE≦Vext, but may only meet the condition of VppE>Vext provided that the forward current is negligibly small in terms of practical operations even if the p-n junction of the p-well and the n-type substrate is forward-biased.

A case will be considered where the second embodiment is applied to an erase mode test simultaneously run on a plurality of chips on the same wafer. Since in the second embodiment, an external input voltage is supplied as the substrate voltage, VppE applied to the p-well in defective CHIP2 and the external input voltage Vext applied to the n-type substrate produces a reverse bias in the examples in FIGS. 9A and 9B. As a result, the VppEs of nondefective CHIP1, CHIP3 to CHIPn are all separated from that of defective CHIP2, making it possible to distinguish the defective one. In this way, with this embodiment, too, a plurality of chips on the same wafer can be simultaneously put to the sorting out of defectives from nondefectives and to a reliability test.

While in the embodiment, how to apply a bias to the n-type substrate in an erase operation has been explained, a biasing method may be changed according to the way of operating chips on the same wafer. For example, a conventional method may be used to operate a single chip, and the second embodiment may be used only when a plurality of chips on the same wafer are operated.

FIGS. 16A and 16B are a circuit diagram of the substrate voltage controller with the function of switching according to an external signal between the second embodiment when a plurality of chips on the same wafer are operated and a conventional system when a single chip is operated in a normal operation, and their timing chart, respectively. FIG. 16A shows an example of applying an external voltage of Vext to the n-type substrate via transistor $Q_{D3}$.

As seen from the operation timing of FIG. 16B, when a plurality of chips on the same wafer are in operation and the voltage of p-well is at VppE, $Q_{D1}$ and $Q_{D2}$ are both inactive and $Q_{D3}$ is active, which permits the external voltage Vext to be applied to the n-type substrate. This prevents the VppEs of the other chips from dropping even if any one of the chips is defective, permitting a large leakage current. As a result, a plurality of chips can be checked and tested simultaneously.

A modification of applying an external input voltage to the n-type substrate is shown in FIGS. 17A and 17B. In the modification, the external input voltage is directly applied from an electrode (PAD) provided on the chip to the n-type substrate. Although in FIG. 17A, for the sake of convenience, PAD is written as if it were contained in the substrate voltage controller, the external input voltage is controlled by the controller. In this sense, it can be considered to be a modification of the first embodiment of FIG. 10A. The PAD is particularly provided for the operation of a plurality of chips on the same wafer and is normally not connected to an external terminal, but may be drawn out of the package.

In FIG. 17B, like FIG. 16B, when a plurality of chips on the same wafer operate, $Q_{D1}$ and $Q_{D2}$ are both inactive, which permits the external input voltage to be applied to the substrate via an electrode (PAD) provided on the chip surface. As a result, a plurality of chips can be checked and tested simultaneously. Because the external input voltage PAD is placed in a floating state in a single chip operation in FIG. 17B, the voltage at the PAD is equal to the voltage at the n-type substrate.

While in FIG. 17A, the embodiment is explained where the external input voltage applied to the substrate is supplied from the PAD, the present invention is not limited to this. For instance, by applying the external input voltage to a table (stage) on which a wafer is placed, the external input voltage may be applied to the n-type substrate without an input pad for the external input voltage.

Transistors $Q_{D1}$, $Q_{D2}$, and $Q_{D3}$ in FIGS. 16A and 17A are all n-channel D-type transistors. Their threshold value is assumed to be higher than (−Vcc) and lower than 0 V even when a back bias of (−VppE) or (−Vext) is applied.

FIGS. 18A, 18B, 19A, and 19B show other circuit configurations and their operation timing charts in connection with FIGS. 16A and 16B. FIGS. 20A and 20B show other circuit configurations and their operation timing charts in connection with FIGS. 17A and 17B. FIGS. 18A and 18B shows an embodiment in which $Q_{D2}$ and $Q_{D3}$ of FIGS. 16A and 16B are grouped into a single D-type transistor $Q_{D4}$ and instead, a VppE/Vext selection circuit (a circuit for outputting a voltage applied to the substrate, either VppE or Vext, normally outputting the higher of VppE and Vext). FIGS. 21A and 21B show examples of the VppE/Vext selection circuit. X in FIG. 21A and Y in FIG. 21B indicate examples of a high-voltage switching circuit. Another circuit configuration may be applied to this circuit. In FIGS. 21A and 21B, signal EXT goes high when a plurality of chips on the same wafer operate, and goes low for a single chip operation. Thus, at the output, Vext appears when a plurality of chips on the same wafer operate, and VppE appears for a single chip operation. This circuit configuration may be applied to the Vcc/VppE selection circuit.

FIGS. 19A and 19B show a modification where $Q_{D2}$ and $Q_{D3}$ in FIGS. 16A and 16B are replaced with p-channel transistors Qp1 and Qp2. The output voltage of the VppE/Vext selection circuit is applied to the n-well voltage produced in each of Qp1 and Qp2. FIGS. 20A and 20B show a modification where $Q_{D2}$ in FIGS. 17A and 17B is replaced with p-channel transistor Qp1. The output voltage of the VppE/Vext selection circuit is applied to the n-well voltage produced in each of Qp1.

FIGS. 22A to 22C and 23A to 23D show embodiments of other circuit configurations. In these figures, the Vcc/VppE selection circuit and the Vcc/VppE/Vext selection circuit are circuits for outputting a voltage applied to the n-type substrate.

The embodiments may be modified variously. For instance, instead of $Q_{D1}$ in FIGS. 16 to 20, 22A, 23A, and 23B, a p-channel transistor may be used.

In the above embodiments, many n-channel D-type transistors are used. Even when the D-type transistors are replaced with I-type or E-type transistors, a similar operation can be achieved provided that the I-type or E-type transistors can transfer such a voltage as causes no erroneous operation. Therefore, the present invention can be applied to these types of transistors.

As are signal C in FIGS. 16A and 16B and signal D in FIGS. 18A and 18B at the time of operating a plurality of chips on the same wafer, when Vext is supplied to the drain of the n-channel transistor, which transfers it to the source, the gate voltage is Vext in the above embodiments. If such a voltage as does not disturb a proper operation can be transferred to the n-type substrate, VppE may be applied as a gate voltage in place of Vext, for example.

Figure 27A:
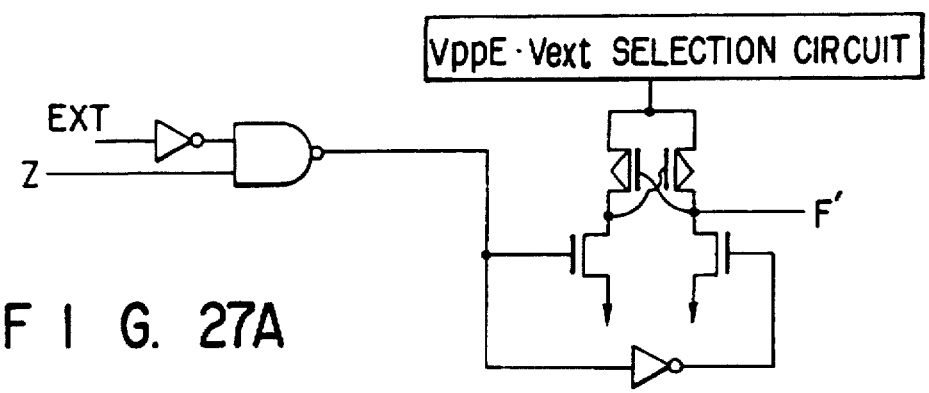
FIGS. 27A and 27B are circuit diagrams of circuits for producing signal F'.
Figure 27B:
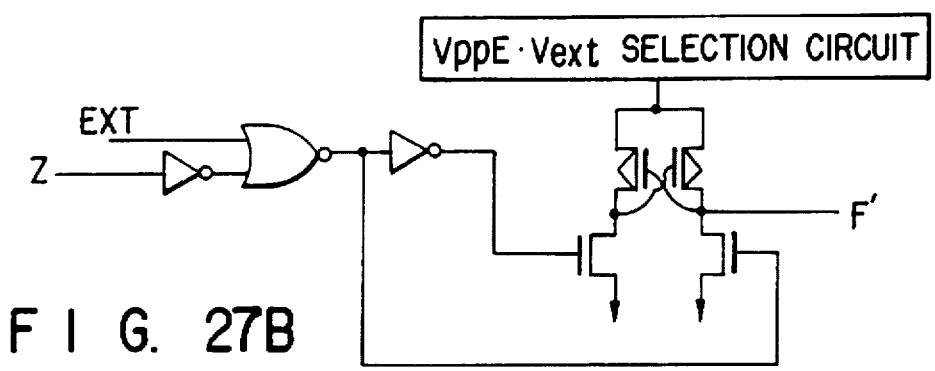
Figure 28A:
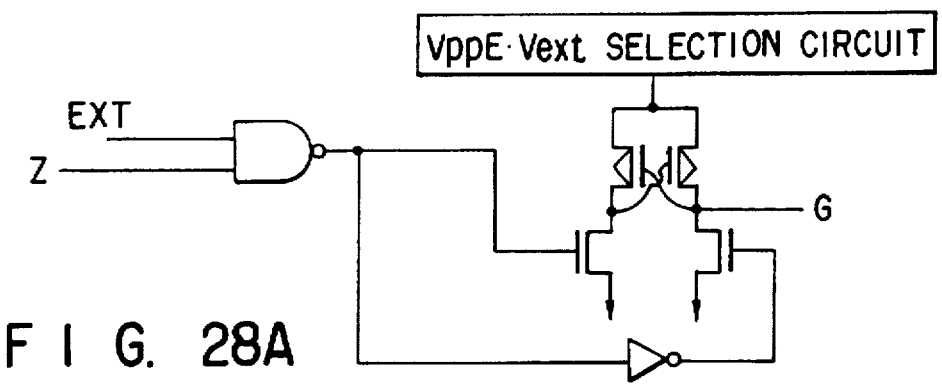
FIGS. 28A and 28B are circuit diagrams of circuit for producing signal G.
Figure 28B:
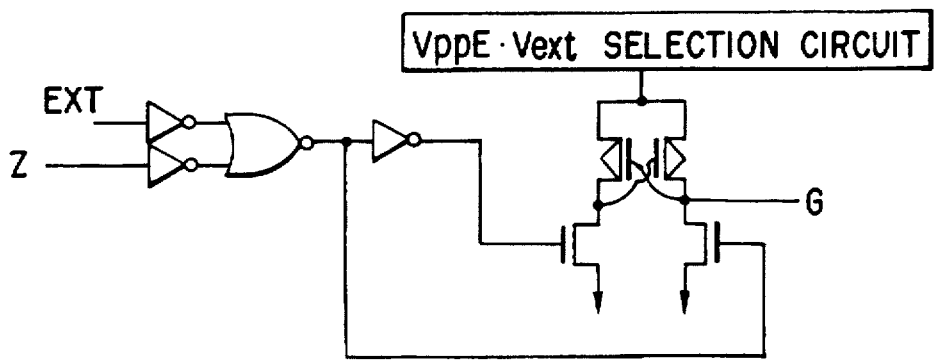

The relationship between means for generating signals A', C, D, F, and G shown in the figures used to explain the above embodiments and the external input signal EXT is shown in FIGS. 24 to 26. The signals A, B, F, H, and I are the same as those in FIGS. 11A to 11C, and 12D to 12F. FIG. 24 shows a circuit for producing signal A'. Signal Z is a signal generated in the chip to start the erase mode, and goes from low to high to turn on the erase mode. FIGS. 25A and 25B show circuits for producing signal C. FIG. 26 shows a circuit for producing signal D. FIGS. 27A and 27B show circuits for producing signal F. FIGS. 28A and 28B show circuits for producing signal G. Use of these circuits allows the external input signal to be included in the resulting signal, which enables the external input signal to control the erase mode. Only the circuit in FIG. 26 does not contain external input signal EXT. As seen from FIGS. 21A and 21B, external input signal EXT is contained in the VppE/Vext circuit, so that the operation can be controlled by EXT, achieving the operation of FIG. 18.

As described above, with the present invention, when a plurality of chips on the same wafer are operated, the method of applying a voltage to the substrate is different from those for other normal operations. Whether a plurality of chips on the same wafer are operated or a single chip is operated is determined by the signal supplied from outside the chip. Therefore, the present invention is characterized in that a method of applying a voltage to the substrate in an erase operation can be changed according to the signal supplied from outside the chip. More specifically, the turning on and off of the transistor connecting the erase voltage VppE to the n-type substrate in an erase operation can be set by the external input signal. When the transistor is a p-channel transistor, switching the voltage at the n-well where a transistor is formed between VppE and Vext is effected by the external input signal.

While in the above embodiments, a method of applying a voltage to the substrate different from that for the other operations is used only when a plurality of chips on the same wafer are used, the method may be changed except when the chips on the same wafer are operated, or three or more methods of applying a voltage to the substrate may be switched by an external input signal. In this way, the present invention may be practiced or embodied in still other ways. In the above embodiments, explanation of data erasing operations has been given. In other operations, for example, when a plurality of chips on the same wafer are operated simultaneously in a read or a write operation, for example, use of the present invention to control the substrate voltage prevents interference between chips.

In the above embodiments, the present invention has been explained using a NAND EEPROM as an example. The invention is not limited to this. While in the embodiments, explanation has been given using an n-type substrate, the invention is, of course, effective in a case where memory cells are formed on an n-well using a p-type substrate and an n-well. While in the embodiments, a voltage higher than Vcc has been applied to the substrate, a voltage lower than Vcc, for example, a negative voltage, may be applied to the substrate. For example, when memory cells and a peripheral circuit are formed on p-wells in an n-type substrate, a method of externally setting an n-type substrate voltage to operate a plurality of chips on the same wafer can be used in a semiconductor device (e.g., a DRAM or an SRAM) that applies the output voltage $V_{BB}$ ($V_{BB}<0$ V) of the negative voltage generator in the chip as a p-well voltage. For example, in a chip which, when charging the p-well to $V_{BB}$, applies a negative voltage to the n-type substrate at the same time, if the chips operated simultaneously contain at least one defective one in which $V_{BB}$ is short-circuited to the ground potential, the potential levels $V_{BB}$ of not only the defective one but also nondefective ones drop close to the ground potential, permitting the nondefective chips to appear defective.

To overcome this problem, when a plurality of chips on the same wafer are tested simultaneously, use of the present invention allows an externally supplied negative voltage to be applied to the substrate via an electrode (PAD), a stage, or a transistor, without applying the output voltage of the negative voltage generator, which makes it possible to test the chips accurately.

While in the above embodiments, the effectiveness of the invention in the operation of applying a voltage higher than Vcc or a negative voltage to the substrate has been explained, the invention is also effective in applying a voltage ranging from 0 V to Vcc to the substrate.

Explained next will be an example of measuring a drawn current of each chip when a voltage applied to the substrate is Vcc or 0 V. A chip, receiving an external input signal from outside the chip, starts to operate. The external input signal is generally taken in the chip at an electrode (PAD) formed on the chip surface. Normally, the ground potential 0 V and the power supply voltage Vcc are also taken in the chip. When a plurality of chips on the same wafer are tested simultaneously, to examine the power consumption of each chip, or the drawn current from Vcc or the 0-V power supply for each chip, requires the separation of the Vcc power supply from the 0-V power supply (Vss power supply) chip by chip as shown in FIG. 29A. In this case, when the substrate voltage has been set at Vcc, because each chip sets the substrate at Vcc at the same time, the difference between Vcc inputted to each chip permits current to flow between the Vcc power supplies, thus making it impossible to measure the drawn current from Vcc.

For example, when among Vcc power supplies i (i=1, 2, . . . , n), the voltage of only Vcc power supply 2 is 0.1 V lower than those of the remaining ones, a large current will flow from Vcc power supplies 1, 3, . . . , n to Vcc power supply 2, which conceals the drawn current from the Vcc power supply for each chip, thus making it impossible to determine the drawn current from the Vcc power supply for each chip. When the substrate voltage is set at 0 V, because each chip sets the substrate voltage at 0 V at the same time, the difference between the ground potential inputted to each chip makes it impossible to measure the drawn current from Vss power supply for each chip.

However, at least in the case of measuring drawn currents, the drawn current for each of a plurality of chips on the same wafer can be measured simultaneously by using a method of bringing the substrate voltage into a floating state as in the first embodiment, or a method of determining the substrate voltage to be an external input voltage supplied from a portion (e.g., another PAD or a stage) different from the PAD to which a regular Vcc power supply or 0-V power supply is inputted as in the second embodiment.

In this way, by adding the function of changing the method of applying a voltage to the substrate according to an external input signal, the drawn current for each of a plurality of chips on the same wafer can be determined at the same time. This application can be modified variously as the first and second embodiments can be.

While in the application, a NAND EEPROM is used, other various types of memories may be used.

As described above, with a semiconductor memory device of the present invention, a voltage generated in the chip is not directly applied to the substrate, and instead the substrate is charged with the p-n junction forward current, or a voltage supplied from outside the chip is applied to the substrate. This prevents a voltage generated in each chip on the same wafer from dropping even if the chips contains a defective one with a large leakage current. Therefore, a plurality of chips on the same wafer can be checked and tested simultaneously, thereby realizing a semiconductor memory device which enables the time required to check and test chips to be shortened.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
    a first conductivity-type semiconductor substrate in which a second conductivity-type well is formed;
    a memory cell array composed of a plurality of memory cells arranged in a matrix in said second conductivity-type well;
    input means for supplying at least one specified power supply voltage required for a normal operation;
    voltage generating means for generating a first voltage from said specified power supply voltage; and
    a substrate voltage control circuit to which said specified power supply voltage and said first voltage are inputted, and which selectively outputs an output voltage to said substrate,
    wherein said substrate voltage control circuit effects a first operation in which said first voltage is outputted as said output voltage to said substrate when said first voltage is applied to said well; and a second operation in which said first voltage is cut off from said substrate while said first voltage is being applied to said well.

2. A semiconductor memory device according to claim 1, wherein said semiconductor substrate in a floating state is charged with said first voltage of said second conductivity-type well in said second operation.

3. A semiconductor memory device according to claim 1, wherein said substrate voltage control circuit contains transistors, which switch on and off application of said first voltage to said semiconductor substrate according to an external input signal.

4. A semiconductor memory device according to claim 3, wherein said transistors are formed on a well provided in said semiconductor substrate, and when said transistors are nonconductive, a voltage equal to a voltage applied to said substrate is applied to said well on which said transistors are formed.

5. A semiconductor memory device according to claim 1, wherein each of said memory cells contains a charge storage layer and a control gate and is electrically rewritable.

6. A semiconductor memory device according to claim 1, wherein said memory cell array is composed of a plurality of memory cells connected in series.

7. A semiconductor memory device according to claim 1, further comprising external power supply voltage input means for supplying an external power supply voltage different from said specified power supply voltage to said semiconductor substrate.

8. A semiconductor memory device according to claim 1, wherein said substrate voltage control circuit is activated during data erase operation.

9. A semiconductor memory device comprising:
    a first conductivity-type semiconductor substrate in which a second conductivity-type well is formed;
    a memory cell array composed of a plurality of memory cells arranged in a matrix in said second conductivity-type well;
    input means for supplying at least one specified power supply voltage required for a normal operation;
    voltage generating means for generating a first voltage from said specified power supply voltage;
    input means for a second voltage not lower than said first voltage; and
    a substrate voltage control circuit to which said specified power supply voltage, said first voltage, and said second voltage are inputted, and which selectively outputs an output voltage to said substrate,
    wherein said substrate voltage control circuit effects a first operation in which said first voltage is outputted as said output voltage to said substrate when said first voltage is applied to said well; and a second operation in which said second voltage is outputted as said output voltage to said substrate while said first voltage is applied to said well.

10. A semiconductor memory device according to claim 9, wherein said substrate voltage control circuit contains transistors, which switch on and off application of said first voltage to said substrate according to an external output signal.

11. A semiconductor memory device according to claim 10, wherein said transistors are formed on a well provided in said semiconductor substrate, and when said transistors are nonconductive, a voltage equal to a voltage applied to said substrate is applied to said well on which said transistors are formed.

12. A semiconductor memory device according to claim 9, wherein each of said memory cells contains a charge storage layer and a control gate and is electrically rewritable.

13. A semiconductor memory device according to claim 9, wherein said memory cell array is composed of a plurality of memory cells connected in series.

14. A semiconductor memory device according to claim 9, wherein said substrate voltage control circuit is activated during data erase operation.

15. A semiconductor memory device comprising:
    a first conductivity-type semiconductor substrate in which a second conductivity-type well is formed;
    a memory cell array composed of a plurality of memory cells arranged in a matrix in said second conductivity-type well;
    input means for supplying at least one specified power supply voltage required for a normal operation;

voltage generating means for generating a first voltage from said specified power supply voltage; and a substrate voltage control circuit, said circuit including means for applying said first voltage to said semiconductor substrate in a first operation mode in which said first voltage is applied to said well; and means for cutting off said first voltage from said semiconductor substrate in a second operation mode in which said first voltage is applied to said well.

16. A semiconductor memory device according to claim 15, wherein said first voltage is applied to said second conductivity-type well and said substrate voltage control circuit makes said substrate in a floating condition so that said substrate is charged with said first voltage applied to said second conductivity-type well.

17. A semiconductor memory device according to claim 15, wherein said semiconductor substrate in a floating state is charged with said first voltage of said second conductivity-type well in said second operation mode.

18. A semiconductor memory device according to claim 15, wherein said substrate voltage control circuit contains transistors which switch on and off application of said first voltage to said semiconductor substrate according to an external input signal.

19. a semiconductor memory device according to claim 18, wherein said transistors are formed on a well provided in said semiconductor substrate, and when said transistors are nonconductive, a voltage equal to a voltage applied to said substrate is applied to said well on which said transistors are formed.

20. A semiconductor memory device according to claim 15, wherein each of said memory cells contains a charge storage layer and a control gate and is electrically rewritable.

21. A semiconductor memory device according to claim 15, wherein said memory cell array is composed of a plurality of memory cells connected in series.

22. A semiconductor memory device according to claim 15, further comprising external power supply voltage input means for supplying an external power supply voltage different from said specified power supply voltage to said semiconductor substrate.

23. A semiconductor memory device according to claim 15, wherein said first voltage is not lower than said specified power supply voltage.

24. A semiconductor memory device comprising:

a first conductivity-type semiconductor substrate in which a second conductivity-type well is formed;

a memory cell array composed of a plurality of memory cells arranged in a matrix form in said second conductivity-type well;

input means for supplying a specified power supply voltage required for a normal operation;

voltage generating means for generating a first voltage from said specified power supply voltage;

input means for supplying a second voltage not lower than said power supply voltage; and a substrate voltage control circuit, said circuit including means for applying said first voltage to said semiconductor substrate in a first operation mode in which said first voltage is applied to said well; and means for applying said second voltage to said substrate in a second operation mode in which said first voltage is applied to said well.

25. A semiconductor memory device according to claim 24, wherein said substrate voltage control circuit contains transistors which switch on and off application of said first voltage to said substrate according to an external input signal.

26. A semiconductor memory device according to claim 25, wherein said transistors are formed on a well provided in said semiconductor substrate, and when said transistors are nonconductive, a voltage equal to a voltage applied to said substrate is applied to said well on which said transistors are formed.

27. A semiconductor memory device according to claim 24, wherein each of said memory cells contains a charge storage layer and a control gate and is electrically rewritable.

28. A semiconductor memory device according to claim 24, wherein said memory call array is composed to a plurality of memory cells connected in series.

29. A semiconductor memory device according to claim 24, wherein said substrate voltage control circuit is activated during a data erase operation.

30. A semiconductor memory device according to claim 24, wherein said first voltage is not lower than said specified power supply voltage.

31. A semiconductor memory device according to claim 1, wherein said first voltage is not lower than said specified power supply voltage.

32. A semiconductor memory device according to claim 9, wherein said first voltage is not lower than said specified power supply voltage.

* * * * *